(12) United States Patent
Choi et al.

(10) Patent No.: US 12,080,348 B2
(45) Date of Patent: Sep. 3, 2024

(54) SEMICONDUCTOR DEVICE

(71) Applicant: Samsung Electronics Co., Ltd., Suwon-si (KR)

(72) Inventors: Kyuwon Choi, Suwon-si (KR); Suk Youn, Seoul (KR); Chanho Lee, Hwaseong-si (KR); Taehyung Kim, Yongin-si (KR); Sangyeop Baeck, Yongin-si (KR); Inhak Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 188 days.

(21) Appl. No.: 17/820,995

(22) Filed: Aug. 19, 2022

(65) Prior Publication Data

US 2023/0178151 A1   Jun. 8, 2023

(30) Foreign Application Priority Data

Dec. 2, 2021 (KR) .......................... 10-2021-0170630

(51) Int. Cl.
*G11C 15/04* (2006.01)
(52) U.S. Cl.
CPC .................................. *G11C 15/04* (2013.01)
(58) Field of Classification Search
CPC ....... G11C 15/04; G11C 15/00; G11C 11/412; G11C 11/416; G11C 11/411
See application file for complete search history.

(56) References Cited

U.S. PATENT DOCUMENTS

| | | |
|---|---|---|
| 7,259,979 B2 | 8/2007 | Sachan et al. |
| 8,929,115 B2 | 1/2015 | Kohli |
| 9,183,933 B2 | 11/2015 | Liaw |
| 9,768,179 B1 | 9/2017 | Liaw |
| 10,387,500 B2 | 8/2019 | Hong et al. |
| 10,644,009 B2 | 5/2020 | Nii et al. |
| 10,734,063 B2 | 8/2020 | Nii |

(Continued)

*Primary Examiner* — Han Yang
(74) *Attorney, Agent, or Firm* — Myers Bigel, P.A.

(57) ABSTRACT

A semiconductor device includes a substrate including a first memory cell, a second memory cell adjacent to the first memory cell in a first direction, and a comparator circuit adjacent to the first and second memory cells in a second direction intersecting the first direction; a true bit line and a complementary bit line electrically connected to the first and second memory cells and extending in the first direction from a first wiring layer on the substrate; a first power supply wiring on the first wiring layer, extending in the first direction between the true bit line and the complementary bit line and electrically connected to the first and second memory cells; first and second word lines extending in the second direction from a second wiring layer on the substrate different from the first wiring layer; first word line pads on the first wiring layer and electrically connecting the first memory cell to the first word line; second word line pads on the first wiring layer and electrically connecting the second memory cell to the second word line; and a first ground pad on the first wiring layer, electrically connected to the first and second memory cells, and in a same position as one of the first word line pads and one of the second word line pads in the second direction.

20 Claims, 17 Drawing Sheets

(56) References Cited

U.S. PATENT DOCUMENTS

| | | | |
|---|---|---|---|
| 2007/0008760 A1* | 1/2007 | Nii | G11C 15/04 365/233.1 |
| 2016/0013190 A1 | 1/2016 | Liaw | |
| 2018/0068708 A1* | 3/2018 | Nii | G11C 15/04 |

* cited by examiner

SEMICONDUCTOR DEVICE

CROSS-REFERENCE TO RELATED APPLICATION

This application claims benefit of priority to Korean Patent Application No. 10-2021-0170630 filed on Dec. 2, 2021 in the Korean Intellectual Property Office, the disclosure of which is incorporated herein by reference in its entirety.

BACKGROUND

Example embodiments of the present disclosure relate to a semiconductor device.

A content-addressable memory may be a special memory used in search applications involving extremely high speeds. A content-addressable memory may be abbreviated as CAM and may also be referred to as an associative memory.

Different from a RAM, which may return data stored at a memory address when a user provides a corresponding address, in a CAM, when a user provides a search term, the CAM may search the entire memory space thereof and may return an address in which a corresponding the search term is present along with data related to the search term.

A CAM cell may basically include a SRAM in charge of storage and a CAM Port in charge of comparison, which may form a CAM cell, and generally, there may be a NOR type CAM and a NAND type CAM.

A NOR type memory may be relatively widely used because a NOR type memory is faster than a NAND type memory, and a 10T (10 transistor) NOR type CAM may be referred to as a binary CAM (BCAM), and a 16T NOR type CAM may be referred to as a ternary CAM (TCAM).

A BCAM may only store 0 or 1 in a cell, whereas a TCAM may store "X" (Don't care) in addition to 0 and 1, such that more flexibility may be provided in searching. For example, when "1" is stored in a TCAM, "1" may be output to a match line when "1" is input to a TCAM search line, and when "0" is input, "0" may be output. When "X" is stored in a TCAM, "1" may be output from a match line regardless of whether "0" or "1" is input to a search line of the TCAM.

Additional costs may be necessary to provide this flexibility, and a TCAM may require additional memory to store an "X" state as compared to a BCAM.

SUMMARY

An example embodiment of the present disclosure may provide a semiconductor device having improved integration density and performance.

An example embodiment of the present disclosure may provide an improved layout of metal wiring formed on a TCAM cell region.

According to an example embodiment of the present disclosure, a semiconductor device includes a substrate including a first memory cell, a second memory cell adjacent to the first memory cell in a first direction, and a comparator circuit adjacent to the first and second memory cells in a second direction intersecting the first direction; a true bit line and a complementary bit line electrically connected to the first and second memory cells and extending in the first direction from a first wiring layer on the substrate; a first power supply wiring on the first wiring layer, extending in the first direction between the true bit line and the complementary bit line and electrically connected to the first and second memory cells; first and second word lines extending in the second direction from a second wiring layer on the substrate different from the first wiring layer; first word line pads on the first wiring layer and electrically connecting the first memory cell to the first word line; second word line pads on the first wiring layer and electrically connecting the second memory cell to the second word line; and a first ground pad on the first wiring layer, electrically connected to the first and second memory cells, and in a same position as one of the first word line pads and one of the second word line pads in the second direction.

According to an example embodiment of the present disclosure, a semiconductor device includes a substrate including a storage region and a comparison region; first to fourth active regions extending in a first direction from the storage region and spaced apart from each other in a second direction intersecting the first direction; a fifth active region spaced apart from the fourth active region in the second direction in the comparison region and extending in the first direction; first and fourth gate structures extending in the second direction and intersecting the first to fourth active regions; second and third gate structures extending in the second direction and intersecting the first to fifth active regions; a fifth gate structure extending in the second direction, intersecting the fifth active region, and in a same position as the first gate electrode in the first direction; a sixth gate structure extending in the second direction, intersecting the fifth active region, and in a same position as the fourth gate electrode in the first direction; active contacts adjacent to the first to sixth gate structures and connected to at least one of the first to fifth active regions; a first word line pad connected to the second gate structure, and a second word line pad in a same position as the first word line pad in the second direction and connected to the third gate structure; a third word line pad connected to the first gate structure, and a fourth word line pad in a same position as the third word line pad in the second direction and connected to the fourth gate structure; a first ground pad in a same position as the first and second word line pads in the second direction, connected to the first active region, and connected to an active contact adjacent to the first gate structure; a second ground pad disposed in the same position as the first and second word line pads in the second direction, connected to the first active region, and connected to an active contact adjacent to the fourth gate structure; and a third ground pad in a same position as the third and fourth word line pads in the second direction, connected to the fourth active region, and connected to an active contact shared by the second and third gate structures.

According to an example embodiment of the present disclosure, a semiconductor device includes a substrate including an active region extending in a first direction, first to fourth gate structures intersecting the active region and extending in a second direction, active contacts adjacent to at least one of the first to fourth gate structures, and first and second memory cells connected to second and third gate structures, respectively; a first search line extending in the first direction from a first wiring layer on the substrate and connected to the first gate structure; a second search line extending in the first direction from the first wiring layer and connected to the fourth gate structure; and a first ground wiring on the first wiring layer, extending in the first direction between the first and second search lines, and connected to an active contact adjacent to the first gate structure and an active contact adjacent to the fourth gate structure.

According to an example embodiment of the present disclosure, a semiconductor device includes a substrate including an active region extending in a first direction, first to fourth gate structures intersecting the active region and extending in a second direction, active contacts adjacent to at least one of the first to fourth gate structures, and first and second memory cells connected to second and third gate structures, respectively; a first ground wiring on a first wiring layer on the substrate and connected to an active contact adjacent to the first gate structure and an active contact adjacent to the fourth gate structure; a first search line extending in the first direction from the first wiring layer and connected to the first gate structure; a second search line extending in the first direction from the first wiring layer and connected to the fourth gate structure; and a match line pad connected to an active contact shared by the second and third gate structures on the first wiring layer, wherein the first and second search lines are between the first ground wiring and the match line pad, and the first ground wiring is adjacent to the first and second memory cells.

According to an example embodiment of the present disclosure, a semiconductor device includes a substrate including an active region extending in a first direction, first to fourth gate structures intersecting the active region and extending in a second direction, active contacts adjacent to at least one of the first to fourth gate structures, and first and second memory cells connected to the second and third gate structures, respectively; a first search line extending in the first direction from a first wiring layer on the substrate and connected to the first gate structure; a second search line extending in the first direction from the first wiring layer and connected to the fourth gate structure; a match line pad connected to an active contact shared by the second and third gate structures on the first wiring layer; and a first ground pad connected to an active contact adjacent to the first gate structure on the first wiring layer; a second ground pad connected to an active contact adjacent to the fourth gate structure on the first wiring layer, wherein the first and second ground pads and the match line pad are in a same position in the second direction.

BRIEF DESCRIPTION OF DRAWINGS

The above and other aspects, features, and advantages set forth in the present disclosure will be more clearly understood from the following detailed description, taken in combination with the accompanying drawings, in which.

DETAILED DESCRIPTION

Figure 1:
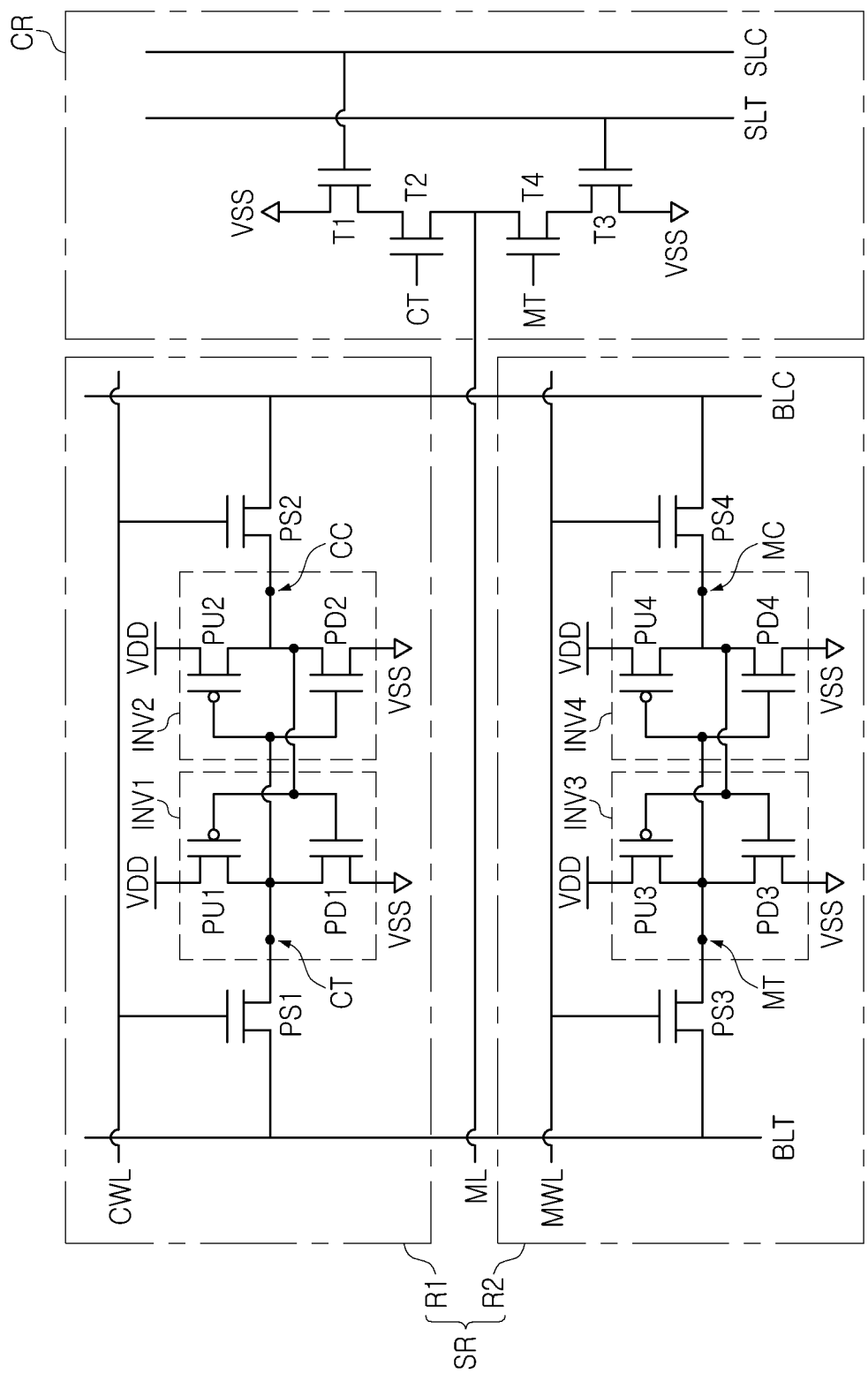
FIG. 1 is a circuit diagram illustrating a ternary content-addressable memory (TCAM) according to an example embodiment of the present disclosure.

Hereinafter, embodiments of the present inventive subject matter will be described with reference to the accompanying drawings. The present inventive subject matter may, however, be embodied in many different forms and should not be construed as limited to the embodiments set forth herein. In the drawings, like numerals refer to like elements throughout this application and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a circuit diagram illustrating a ternary content-addressable memory (TCAM) according to an example embodiment.

The TCAM cell region may include a storage region SR and a comparison region CR. The storage region SR may include a first cell region R1 and a second cell region R2.

The first cell region R1 may include first and second inverters INV1 and INV2 connected to each other in parallel between the power terminal VDD and the ground terminal VSS, and pass transistors PS1 and PS2 connected to output terminals of the first and second inverters INV1 and INV2. The first and second inverters INV1 and INV2 and the first and second pass transistors PS1 and PS2 may provide a first memory cell.

Each of the first and second pass transistors PS1 and PS2 may be connected to a true bit line BLT and a complementary bit line BLC. Gates of the first and second pass transistors PS1 and PS2 may be connected to the data word line CWL.

The first inverter INV1 may include a first pull-up transistor PU1 and a first pull-down transistor PD1 connected to each other in series, and the second inverter may include a second pull-up transistor PU2 and a second pull-down transistor connected to each other in series. The first and second pull-up transistors PU1 and PU2 may be configured as P-channel MOS (PMOS) transistors, and the first and second pull-down transistors PD1 and PD2 may be configured as N-channel MOS (NMOS) transistors.

The first inverter INV1 and the second inverter INV2 may be included in a single latch circuit. Specifically, an input terminal of the first inverter INV1 may be connected to an output terminal of the second inverter INV2, and an input terminal of the second inverter INV2 may be connected to an output terminal of the first inverter INV1.

Similarly, the second cell region R2 may include third and fourth inverters INV3 and INV4 connected to each other in parallel between the power terminal VDD and the ground terminal VSS, and third and fourth pass transistors PS3 and PS4 connected to output terminals of the third and fourth inverters INV3 and INV4. The third and fourth inverters INV3 and INV4 and the third and fourth pass transistors PS3 and PS4 may provide a second memory cell.

The third pass transistor PS3 and the fourth pass transistor PS4 may be connected to the true bit line BLT and the complementary bit line BLC, respectively. Gates of the third and fourth pass transistors PS3 and PS4 may be connected to the mask word line MWL.

The third inverter INV3 may include a third pull-up transistor PU3 and a third pull-down transistor PD3 connected to each other in series, and the fourth inverter INV4 may include a fourth pull-up transistor PU4 and a fourth pull-down transistor PD4 connected to each other in series. The third and fourth pull-up transistors PU3 and PU4 may be configured as PMOS transistors, and the third and fourth pull-down transistors PD3 and PD4 may be configured as NMOS transistors.

The third inverter INV3 and the fourth inverter INV4 may be included in a latch circuit. Specifically, an input terminal of the third inverter INV3 may be connected to an output terminal of the fourth inverter INV4, and an input terminal of the fourth inverter INV4 may be connected to an output terminal of the third inverter INV3.

The first cell region R1 and the second cell region R2 of the semiconductor device in an example embodiment may be included in a data cell and/or a mask cell. In the example in FIG. 1, the first memory cell of the first cell region R1 may be configured as a data cell, and the second memory cell of the second cell region R2 may be configured as a mask cell. However, example embodiments thereof are not limited thereto, and the second memory cell may be configured as a data cell and the first memory cell may be configured as a mask cell.

To store data in the TCAM, data may be stored in the first cell region R1 through the true bit line BLT, and mask data may be stored in the second cell region R2. For example, when data "1" is to be stored in the TCAM, data "1" may be stored in the first cell region R1 and data "0" may be stored in the second cell region R2.

Specifically, to store data "1" in the first cell region R1, a voltage may be applied to the data word line CWL to turn on the first and second pass transistors PS1 and PS2, and a voltage corresponding to data "1" may be applied to the bit line BLT, and a voltage corresponding to data "0" may be applied to the complementary bit line BLC. When data "1" is stored in the first cell region R1, a voltage corresponding to data "1" may be generated at the true data node CT, that is, an output terminal of the first inverter INV1 and an input terminal of the second inverter INV2, and a voltage corresponding to data "0" may be generated at the complementary data node CC, that is, an output terminal of the second inverter INV2 and an input terminal of the first inverter INV1.

To store data "0" in the second cell region R2, a voltage may be applied to the mask word line MWL to turn on the third and fourth pass transistors PS3 and PS4, a voltage corresponding to data "0" may be applied to the true bit line BLT, and a voltage corresponding to data "0" may be applied to the complementary bit line BLC. When data "0" is stored in the second cell region R2, a voltage corresponding to data "0" may be generated at the true mask node MT, that is, an output terminal of the third inverter INV3 and an input terminal of the fourth inverter INV4, and a voltage corresponding to data "1" may be generated at the complementary mask node MC, that is, an output terminal of the fourth inverter INV4 and an input terminal of the third inverter INV3.

When "0" is stored in both the data cell and the mask cell, data stored in the storage region SR may represent "Don't care" (X). "Don't care" may be a value including both "1" and "0."

The comparison region CR may include first to fourth transistors T1-T4. The first transistor T1 may connect the ground terminal VSS to the second transistor T2 in series using a voltage of the true search line SLT as a gate voltage. The second transistor T2 may connect the first transistor T1 to the match line ML in series using the voltage of the true mask node MT as a gate voltage. The third transistor T3 may connect the ground terminal VSS to the fourth transistor T4 in series using the voltage of the complementary search line SLC as a gate voltage. The fourth transistor T4 may connect the third transistor T3 to the match line ML in series using the voltage of the true data node CT as a gate voltage.

The first to fourth transistors T1-T4 of the comparison region CR may be included in a comparator circuit. The comparator circuit may be configured to compare a signal applied to the search line pair SLT and SLC with the voltage generated at the true data node CT and the true mask node MT, and may output a logic "0" or "1" signal to the match line ML.

To search for data from the TCAM, both the data word line CWL and the mask word line MWL may be turned off, and the match line ML terminal may be precharged. When data "0" is searched for, the true search line SLT may be turned off as "0" and the complementary search line SLC may be turned on as "1." When the true search line STL is turned off as "0," the gate voltage signal of the third transistor T3 may become "0" and the third transistor T3 may be turned off. Also, when the complementary search line SLC is turned on as "1," the gate voltage signal of the first transistor T1 may become "1" and the first transistor T1 may be turned on.

When the data stored in the first cell region R1 is "0," the gate voltage signal of the second transistor T2 may be "0." Because the match line ML is floated by the second and third transistors T2 and T3, the terminal of the precharged match line ML may maintain a "1" state, which may indicate a match state. When the data stored in the first cell region R1 is "1," the gate voltage signal of the second transistor T2 may become "1" and the second transistor T2 may be turned on. Because the match line ML may be connected to the ground signal VSS by the first and second transistors T1 and T2, the terminal of the match line ML may be discharged and the terminal value may become "0," which may indicate a "no match" state.

When the Don't care value is stored in the TCAM, that is, when "0" is stored in the first cell region R1 and "0" is also stored in the second cell region R2, gate voltage signals of both the second transistor T2 and the fourth transistor T4 may be "0." In this case, regardless of whether the true search line SLT is turned on as "1" or turned off as "0," the match line ML may float and a precharged state may be maintained. Accordingly, the match line ML may indicate a match regardless of the state of the true search line SLT.

A plurality of wiring patterns may be formed on the first cell region R1, the second cell region R2, and the comparison region CR included in the TCAM. For example, a power supply wiring pattern and a ground wiring pattern may be formed on the aforementioned regions, and wiring patterns for providing a word line signal, a bit line signal, and a search line signal may be formed, and a wiring pattern for outputting a match line signal from the comparison region may be formed. When the plurality of wiring patterns are not efficiently arranged, a region of the semiconductor circuit occupied by the wiring patterns may increase such that integration density of the semiconductor circuit including the TCAM cell may decrease.

Hereinafter, a layout in which integration density of a semiconductor circuit including a TCAM cell may improve may be provided.

Figure 2:
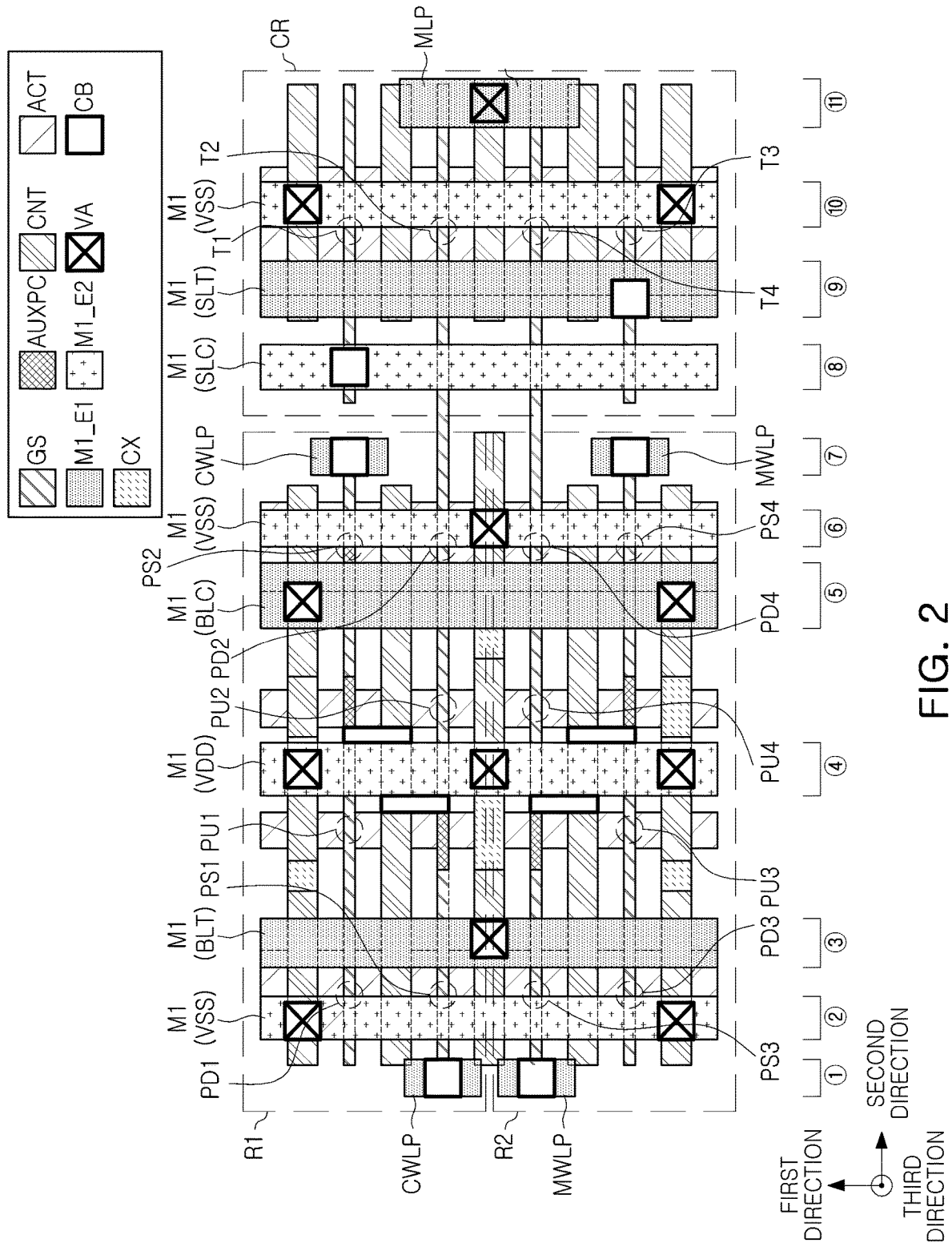
FIG. 2 is a layout diagram illustrating a semiconductor device according to a comparative example of the present disclosure.

FIG. 2 is a layout diagram illustrating a semiconductor device according to a comparative example.

Referring to FIG. 2, the semiconductor device according to the comparative example may include a first cell region R1, a second cell region R2, and a comparison region CR. The first cell region R1, the second cell region R2, and the comparison region CR may correspond to those described with reference to FIG. 1. Referring to FIG. 2, the first cell region R1 and the second cell region R2 may be adjacent to each other in the first direction, and the comparison region CR may be adjacent to the first cell region R1 and the second cell region R2 in the second direction.

The semiconductor device according to the comparative example may include active regions ACT extending in a first direction and gate structures GS extending in a second direction and intersecting the active regions ACT. The active regions ACT and the gate structures GS may provide a plurality of semiconductor devices.

For example, one of the gate structures GS and the active regions ACT disposed on both sides of the gate structures GS may provide a transistor. The active regions ACT may be connected to the active contacts CNT adjacent to the gate structures GS. Transistors included in the semiconductor device may be connected to each other and may provide the circuit described with reference to FIG. 1. In FIG. 2, regions in the first cell region R1, the second cell region R2, and the comparison region CR in which pass transistors PS1-PS4, pull-up transistors PU1-PU4, pull-down transistors PD1-PD4, and first to fourth transistors T1-T4 may be formed, respectively, are illustrated.

The semiconductor device may include lower wiring patterns M1 connected to at least one of the gate structures GS and active regions ACT. The lower wiring patterns M1 may be formed of a conductive material, such as metal or metal silicide, and may extend in the first direction as illustrated in FIG. 2. A portion of the lower wiring patterns M1 may be disposed in the same position in the second direction and may be insulated from each other. For example, a data word line pad CWLP connecting the data word line to the gate of the first pass transistor PS1, and a mask word line pad MWLP connecting the mask word line to the gate of the second pass transistor PS2 may be disposed in the same position in the second direction and may be insulated from each other.

In FIG. 2, wiring patterns adjacent to each other among the lower wiring patterns M1 may be configured as different patterns M1_E1 and M1_E2. According to the trend toward refinement of semiconductor processes, the gaps between adjacent lower wiring patterns may be formed to be sufficiently narrow and to not interfere with each other. To form the wiring patterns, such that the lower wiring patterns adjacent to each other do not interfere with each other, different processes may be used for the lower wiring patterns M1_E1 and M1_E2 adjacent to each other. For example, a first process of depositing a metal on the wiring layer, etching the metal, depositing an insulator, and forming the lower wiring patterns M1_E1 may be performed, and a second process of etching the insulator between the lower wiring patterns M1_E1, depositing a metal, and forming lower wiring patterns M1_E2 adjacent to the lower wiring patterns M1_E1 may be performed.

The lower wiring patterns M1 may be connected to at least one of the gate structures GS through the gate contact CB, and may provide a signal path through which an input signal is transmitted to a circuit provided by the semiconductor device. The input signal may be input to one of the gate structures GS through at least one of the lower wiring patterns M1, and the output signal may be output through at least one of the active regions ACT.

According to the comparative example in FIG. 2, the lower wiring patterns M1 formed on the TCAM cell region may include three ground wirings M1 (VSS). Two of the three ground wirings M1 (VSS) may provide a ground for the first cell region R1 and the second cell region R2, and the other ground wiring may provide a ground for the comparison region CR. Lower wiring patterns M1 may be formed in 11 tracks on the upper portion of the TCAM cell region in the second direction, including three ground wirings M1 (VSS). For example, the data word line pad CWLP and the mask word line pad MWLP may be disposed on the first track ①, and the lower wiring patterns M1 may be formed in 11 tracks in the same manner as disposing the ground wiring M1 (VSS) in the second track ②. Even when TCAM cells adjacent to each other share the lower wiring patterns M1 on both ends of the TCAM cell, the lower wirings M1 may be formed in 10 tracks on average in the second direction per TCAM cell. The length of the TCAM cell region in the second direction may increase based on the number of the lower wiring patterns M1, and an increase in the length of the TCAM cell region may increase the area of the semiconductor device.

In example embodiments, a semiconductor device in which the number of ground wirings M1 (VSS) included in a TCAM cell region is reduced and accordingly, integration density may improve may be provided. Hereinafter, a semiconductor device according to the example embodiments will be described in greater detail with reference to FIGS. 3 to 13.

Figure 3:
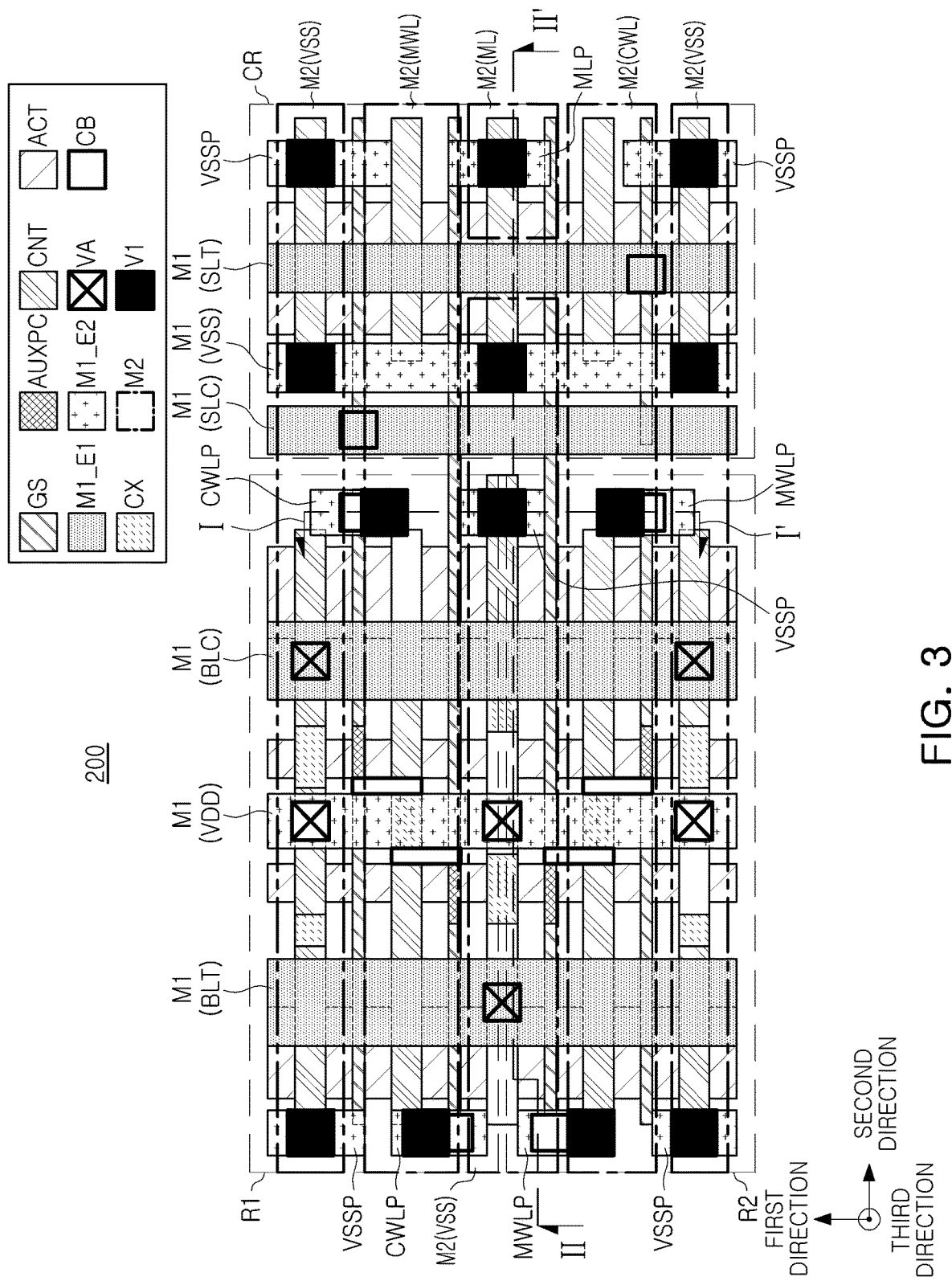
FIG. 3 is a layout diagram illustrating a semiconductor device according to a comparative example of the present inventive subject matter.
Figure 4:
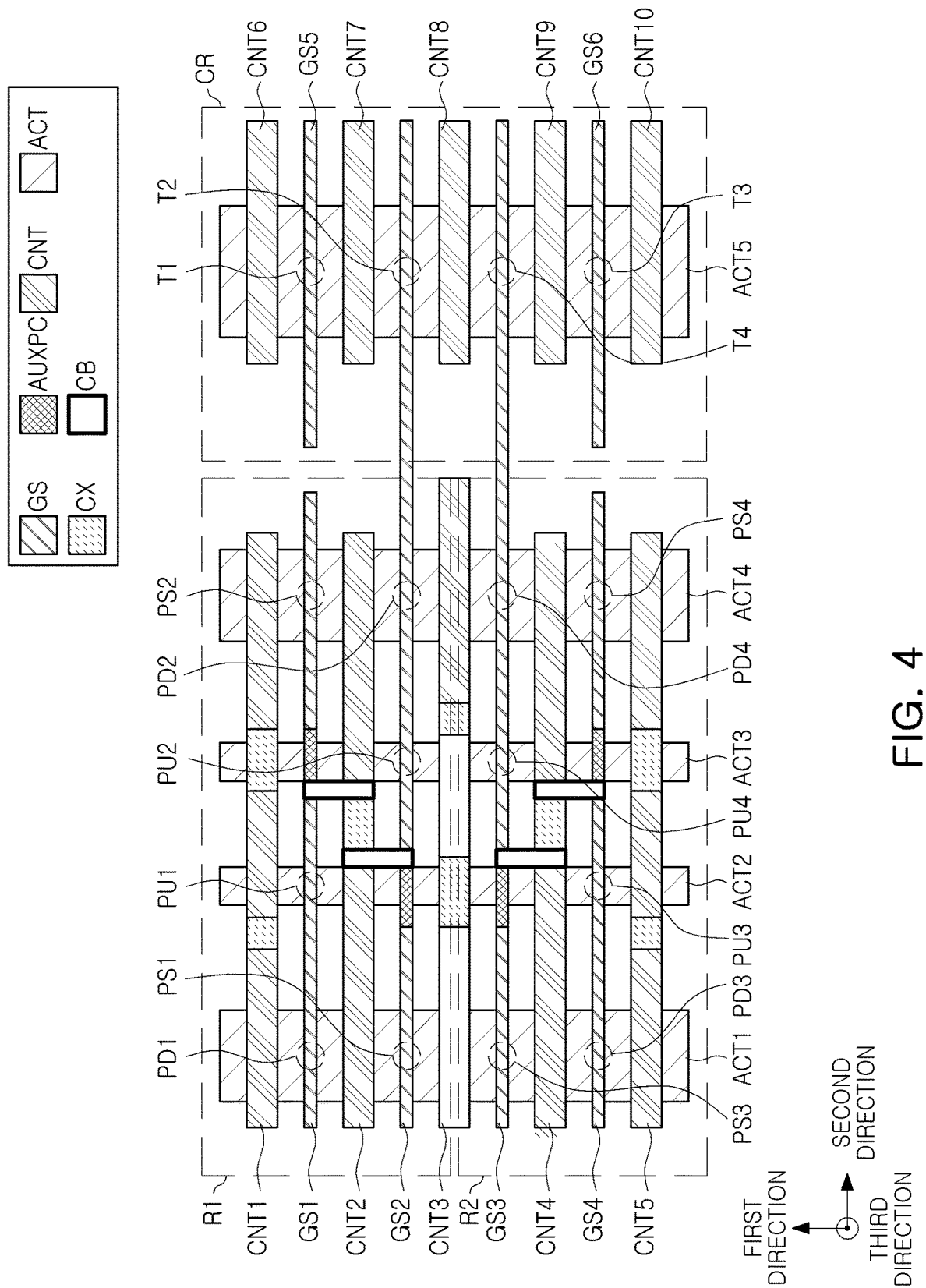
FIG. 4 is a layout diagram illustrating a layout of a front-end process of the layout diagram in FIG. 3.
Figure 5:
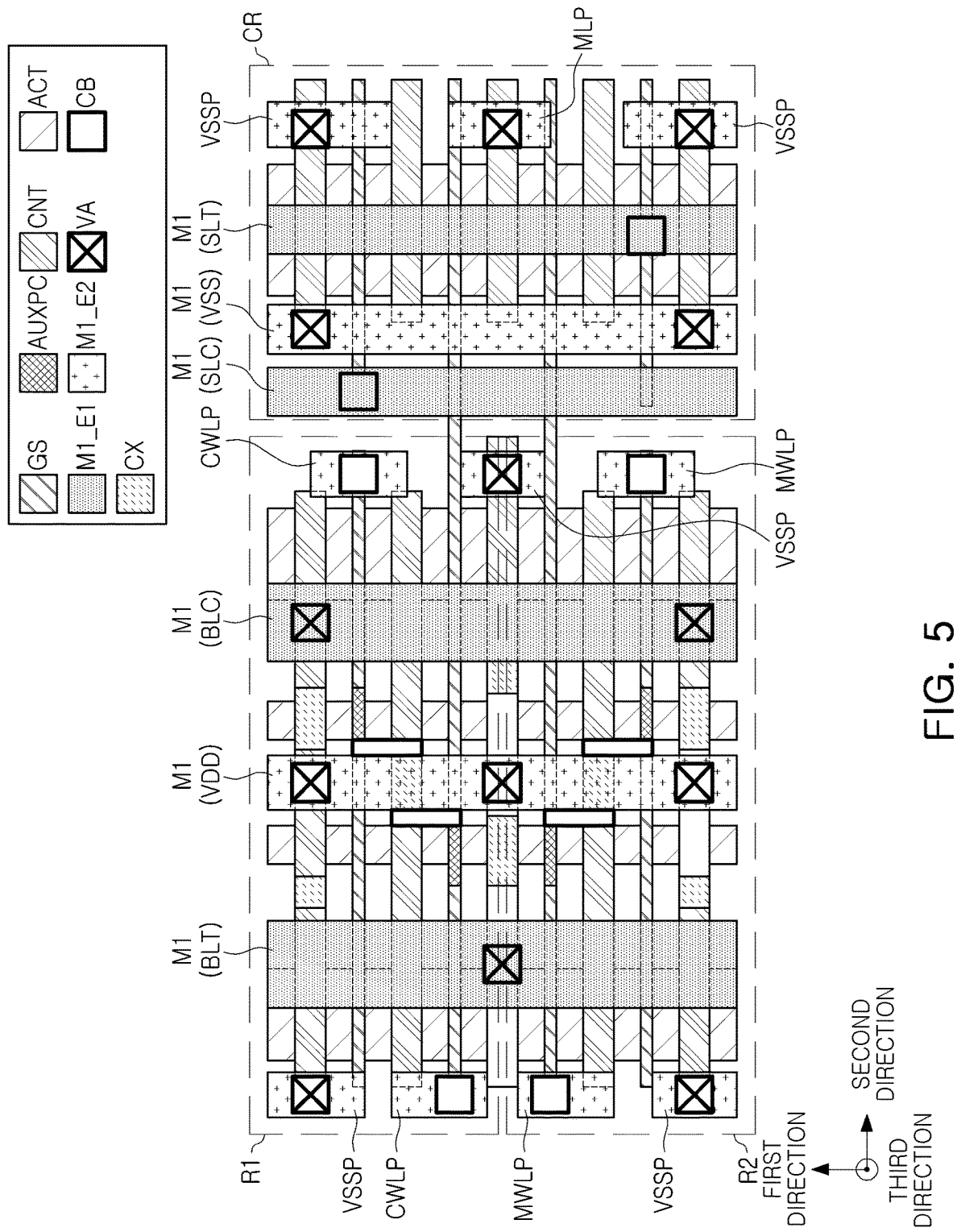
FIG. 5 is a layout diagram illustrating an example in which a first wiring layer is added to the layout in FIG. 4.
Figure 6:
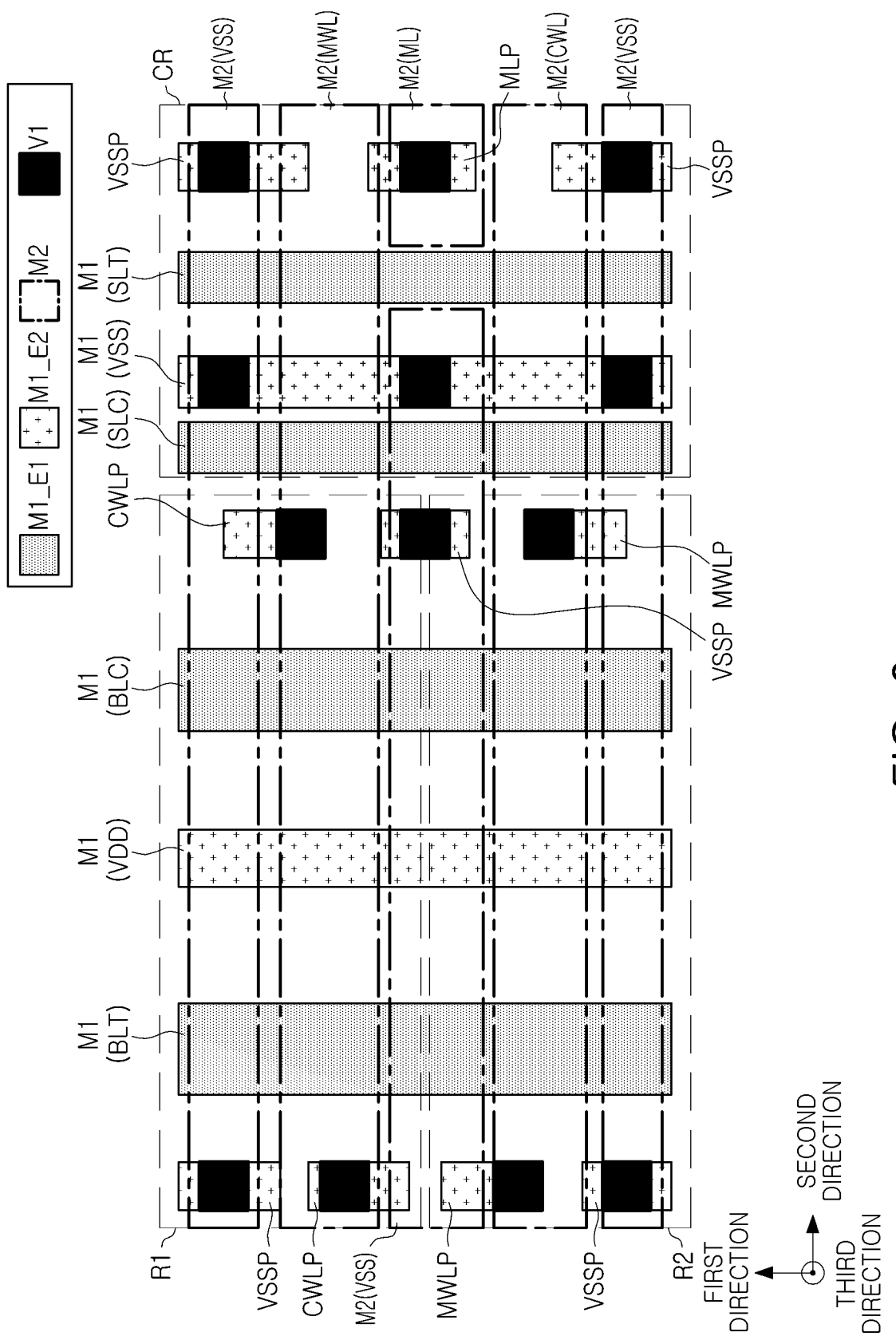
FIG. 6 is a layout diagram illustrating first and second wiring layers in the layout diagram in FIG. 3.
Figure 7:
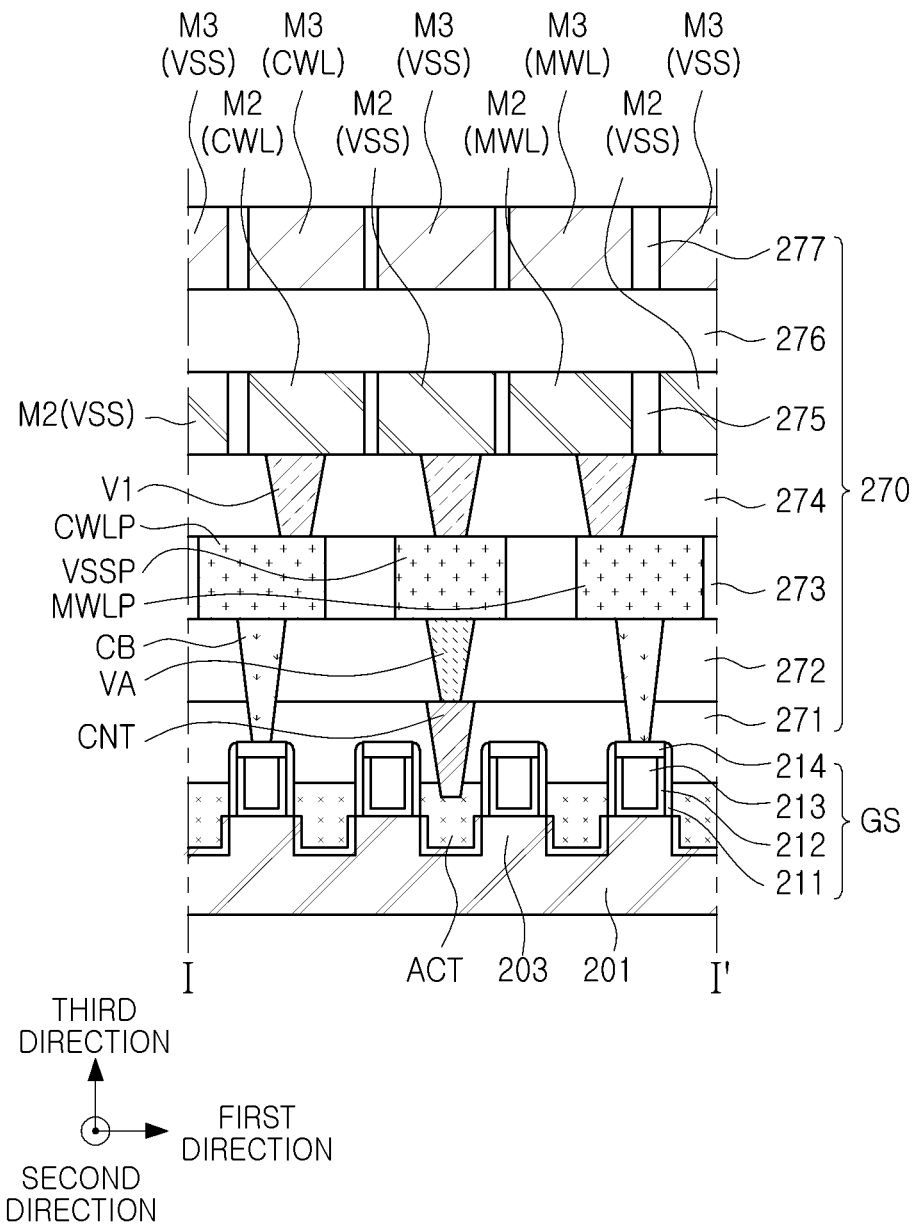
FIG. 7 is a cross-sectional diagram illustrating the layout in FIG. 3 taken along line I-I'.
Figure 8:
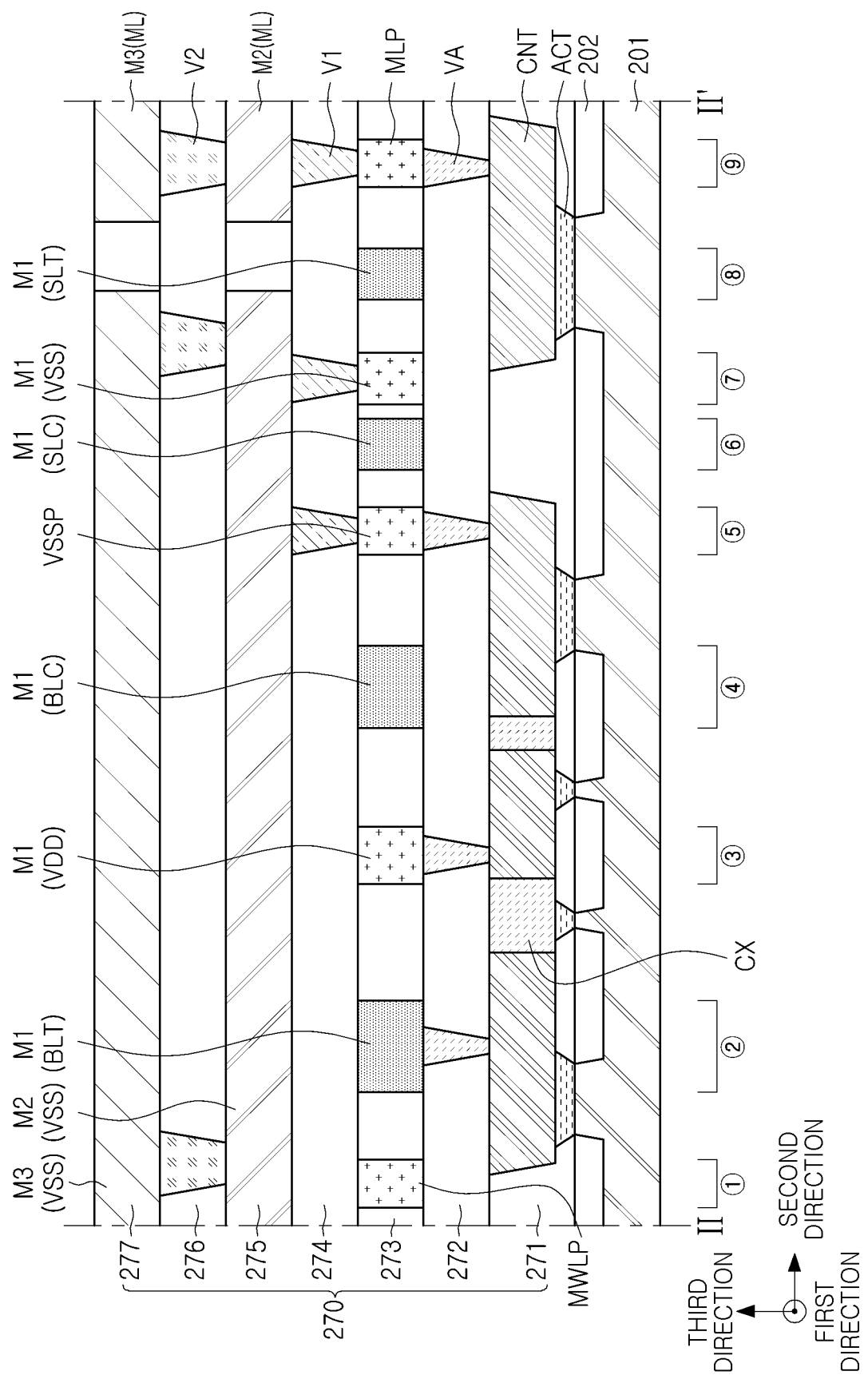
FIG. 8 is a cross-sectional diagram illustrating the layout in FIG. 3 taken along line II-II'.

FIG. 3 is a layout diagram illustrating a semiconductor device according to a comparative example of some embodiments of the inventive subject matter. FIG. 4 is a layout diagram illustrating a layout of a front-end process of the layout diagram in FIG. 3. FIG. 5 is a layout diagram illustrating an example in which a first wiring layer is added to the layout in FIG. 4. FIG. 6 is a layout diagram illustrating first and second wiring layers in the layout diagram in FIG. 3. FIG. 7 is a cross-sectional diagram illustrating the layout in FIG. 3 taken along line I-I'. FIG. 8 is a cross-sectional diagram illustrating the layout in FIG. 3 taken along line II-II'.

Referring to FIGS. 3 to 8, a semiconductor device 200 in an example embodiment may include a substrate 201, active regions ACT, gate structures GS, active contacts CNT, and wiring patterns M1, M2, and M3.

The substrate 201 may be formed of one or more semiconductor materials including, but not limited to, Si, Ge, SiGe, GaP, GaAs, SiC, SiGeC, InAs, and/or InP. Also, a silicon on insulator (SOI) substrate may be used.

The substrate 201 may include a first cell region R1, a second cell region R2, and a comparison region CR. The first cell region R1, the second cell region R2, and the comparison region CR may be included in a TCAM cell region, and each region may correspond to the example described with reference to FIG. 1. Referring to FIG. 3, the first cell region R1 and the second cell region R2 may be adjacent to each other in the first direction. The comparison region CR may be adjacent to the first cell region R1 and the second cell region R2 in the second direction.

Referring to FIG. 3, the boundary line between the first cell region R1 and the second cell region R2 may extend in the second direction, and the boundary line between the first cell region R1 and the comparison region CR may extend in the first direction. A boundary line between the second cell region R2 and the comparison region CR may also extend in the first direction.

The first direction and the second direction may be perpendicular to each other. However, example embodiments thereof are not limited thereto. The third direction may be perpendicular to both the first direction and the second direction.

The first cell region R1 and the second cell region R2 may be a storage region SR. A first memory cell and a second memory cell as described with reference to FIG. 1 may be formed in the first cell region R1 and the second cell region R2.

The comparison region CR may be configured to compare signals of the first cell region R1 and the second cell region R2 with a signal input to the true search line SLT. The semiconductor device 200 in an example embodiment may form a TCAM cell including a first cell region R1, a second cell region R2, and a comparison region CR.

Referring to FIG. 4, the semiconductor device 200 may include active regions ACT1-ACT5 extending in a first direction and may be spaced apart from each other in a second direction. Among the active regions ACT1-ACT5, the first, fourth, and fifth active regions ACT1, ACT4, and ACT5 may be configured as N-type doped regions, and the second and third active regions ACT2 and ACT3 may be configured as P-type doped regions.

Also, the semiconductor device 200 may include gate structures GS1-GS6 extending in the second direction and spaced apart from each other in the first direction. The second gate structure GS2 among the gate structures GS1-GS6 may extend across the first cell region R1 and the comparison region CR, and the third gate structure GS3 may extend across the second cell region R2 and the comparison region CR. The first and fifth gate structures GS1 and GS5 may be disposed in the same position in the first direction and may be insulated between the first cell region R1 and the comparison region CR. Also, the fourth and sixth gate structures GS4 and GS6 may be disposed in the same position in the first direction and may be insulated between the second cell region R2 and the comparison region CR.

Active contacts CNT1-CNT10 may extend in the second direction between the gate structures GS1-GS6. The active contacts CNT1-CNT10 may connect the active regions ACT1-ACT5 to wiring patterns.

A gate cut CT for insulation between adjacent transistors sharing the gate structure may be formed in each of the gate structures GS1-GS4. Also, an active cut CX for insulation between adjacent transistors sharing the active contact may be formed in each of the active contacts CNT1-CNT5. The gate cut may be disposed on a single gate structure in FIG. 4, but example embodiments thereof are not limited thereto. For example, a single gate cut CT may be disposed to cross the second and third gate structures GS2 and GS3, and may cut both the second and third gate structures GS2 and GS3. Also, the positions, shapes, and sizes of the gate cut CT and the active cut CX may be varied in example embodiments.

One of the gate structures GS1-GS6 and the active regions ACT disposed on both sides thereof may provide a transistor. The active regions ACT may be connected to active contacts CNT adjacent to the gate structures GS. Transistors included in the semiconductor device may be connected to each other and may provide the circuit described with reference to FIG. 1. In FIG. 4, regions in which pass transistors PS1-PS4, pull-up transistors PU1-PU4, pull-down transistors PD1-PD4, and first to fourth transistors T1-T4 are formed, respectively, are illustrated.

Specifically, the second gate structure GS2 and the first active region ACT1 disposed on both sides thereof may form the first pass transistor PS1, and the first gate structure GS1 and the fourth active region ACT4 disposed on both sides thereof may form the second pass transistor PS2. Also, the third gate structure GS3 and the first active region ACT1 disposed on both sides thereof may form the third pass transistor PS3, and the fourth gate structure GS4 and the fourth active region ACT4 disposed on both sides thereof may form the fourth pass transistor PS4.

The first gate structure GS1 and the first active region ACT1 disposed on both sides thereof may form the first pull-down transistor PD1, and the first gate structure GS1 and the second active region ACT2 disposed on both sides thereof may form the first pull-up transistor PU1. That is, the first pull-down transistor PD1 and the first pull-up transistor PU1 may share the first gate structure GS1. Similarly, the second pull-down transistor PD2 and the second pull-up transistor PU2 sharing the second gate structure GS2 may be formed, the third pull-down transistor PD3 and the second pull-down transistor PD3 sharing the fourth gate structure GS4 may be formed, and the fourth pull-down transistor PD4 and the fourth pull-up transistor PU4 sharing the third gate structure GS3 may be formed.

An input terminal and an output terminal of the inverters may be connected through gate contacts CB. Specifically, the first gate structure GS1 shared by the first pull-up transistor PU1 and the first pull-down transistor PD1 may be connected to the second active contact CNT2 shared by the second pull-up transistor PU2 and the second pull-down transistor PD2 through the gate contact CB. Also, the second gate structure GS2 shared by the second pull-up transistor PU2 and the second pull-down transistor PD2 may be connected to the second active contact CNT2 shared by the first pull-up transistor PU1 and the first pull-down transistor PD1 through the gate contact CB.

Similarly, the fourth gate structure GS4 shared by the third pull-up transistor PU3 and the third pull-down transistor PD3 may be connected to the fourth active contact CNT4 shared by the fourth pull-up transistor PU4 and the fourth pull-down transistor PD4 through the gate contact CB. Also, the third gate structure GS3 shared by the fourth pull-up transistor PU4 and the fourth pull-down transistor PD4 may be connected to the fourth active contact CNT4 shared by the third pull-up transistor PU3 and the third pull-down transistor PD3 through the gate contact CB.

The fifth gate structure GS5 and the fifth active region ACT5 may form the first transistor T1, the second gate structure GS2 and the fifth active region ACT5 may form the second transistor T2, the sixth gate structure GS6 and the fifth active region ACT5 may form the third transistor T3, and the third gate structure GS3 and the fifth active region ACT5 may form the fourth transistor T4.

Referring to FIG. 5, a first wiring layer including lower wiring patterns M1 may be formed on the TCAM cell region in FIG. 4. The lower wiring patterns M1 may extend in the first direction and may be spaced apart from each other in the second direction. A portion of the lower wiring patterns M1 may be disposed in the same position in the second direction and may be insulated from each other.

Referring to FIG. 6, a second wiring layer including intermediate wiring patterns M2 may be formed on the first wiring layer. The intermediate wiring patterns M2 may extend in the second direction and may be spaced apart from each other in the first direction. A portion of the intermediate wiring patterns M2 may be disposed in the same position in the first direction and may be insulated from each other.

Referring to FIGS. 4 to 6, the second gate structure GS2 forming the first pass transistor PS1 may be connected to the data word line pad CWLP through the gate contact CB. The data word line pad CWLP may be connected to the data word line CWL through the lower via V1. Similarly, the first gate structure GS1 forming the second pass transistor PS2 may also be connected to the data word line CWL through the data word line pad CWLP. Also, the fourth gate structure GS4 forming the third pass transistor PS3 may be connected to the mask word line MWL through the mask word line pad MWLP, and the third gate structure GS3 forming the fourth pass transistor PS4 may also be connected to the mask word line MWL through the mask word line pad MWLP.

The third active contact CNT3 between the first active region ACT1 shared by the first and third pass transistors PS1 and PS3 may be connected to a true bit line M1 (BLT) through the active via VA. Also, the first active contact CNT1 connected to the fourth active region ACT4 adjacent to the second pass transistor PS2 may be connected to the complementary bit line M1 (BLC) through the active via VA, and a fifth active contact CNT5 connected to the fourth active region ACT4 adjacent to the fourth pass transistor PS4 may be connected to the complementary bit line M1 (BLC) through the active via VA.

The eighth active contact CNT8 between the fifth active region ACT5 shared by the second and fourth transistors T2 and T4 may be connected to the match line pad MLP through the active via VA. The match line pad MLP may be connected to the match line ML through the lower via V1.

The first to fourth pull-up transistors PU1-PU4 may be connected to power supply wirings M1 (VDD) connected to the first, third, and fifth active contacts CNT1, CNT3, and CNT5 through the active via VA. The first to fourth pull-up transistors PU1-PU4 may receive an external power supply VDD through the power supply wiring M1 (VDD).

In the first example embodiment, the ground wirings M1 (VSS) may be removed from the first wiring layer on the first cell region R1 and the second cell region R2. Also, a ground may be provided to the first to fourth pull-down transistors PD1-PD4 through the ground wiring M1 (VSS) on the comparison region CR.

Specifically, referring to FIG. 5, the ground wiring M1 (VSS) on the comparison region CR may be connected to an external ground. The ground wiring M1 (VSS) on the comparison region CR may be connected to the sixth active contact CNT6 adjacent to the first transistor T1 through the active via VA, and may be connected to the tenth active contact CNT10 adjacent to the third transistor T3 through the active via VA.

Referring to FIG. 6, the ground wiring M1 (VSS) on the comparison region CR may be connected to the ground wirings M2 (VSS) formed in the second wiring layer through the lower via V1. The ground wirings M2 (VSS) may be connected to the ground pads VSSP of the first wiring layer through the lower via V1.

Referring back to FIG. 5, the first active contact CNT1 adjacent to the first pull-down transistor PD1 may be connected to the ground pad VSSP through the active via VA. Similarly, the third active contact CNT3 shared by the second and third pull-down transistors PD2 and PD3 may be connected to the ground pad VSSP through the active via VA, and the fifth active contact CNT5 adjacent to the fourth pull-down transistor PD4 may be connected to the ground pad VSSP through the active via VA.

For example, a single ground wiring M1 (VS S) formed on the first wiring layer on the comparison region CR may provide the ground VSS of the first and third transistors T1 and T3, and may also provide the ground VSS of the first to fourth pull-down transistors PD1-PD4.

In the comparative example described with reference to FIG. 2, three ground wirings M1 (VS S) may be formed on the first wiring layer on the TCAM cell region to provide a ground to the transistors of the TCAM cell. Different from the comparative example, in the first example embodiment, a ground may be provided to the transistors of the TCAM cell using a single ground wiring M1 (VS S) formed on the first wiring layer on the TCAM cell region. The ground pads VSSP formed for the ground VSS of the first to fourth pull-down transistors PD1-PD4 may be in the same position as the data word line pad CWLP and the mask word line pad MWLP in the second direction. That is, the ground pads VSSP, the data word line pad CWLP, and the mask word line pad MWLP may be disposed in a single track. Accordingly, the number of tracks on which the lower wiring patterns M1 are disposed in the TCAM cell may decrease, and the length of the TCAM cell in the second direction may decrease. Accordingly, integration density of the semiconductor circuit including TCAM cells may improve.

Also, in the first example embodiment, the ground wiring M1 (VSS) formed on the comparison region CR may be formed between the true search line M1 (SLT) and a complementary search line M1 (SLC).

In the comparative example described with reference to FIG. 2, the true search line M1 (SLT) and the complementary search line M1 (SLC) may be adjacent to each other. When wiring patterns adjacent to each other are formed in different processes, the true search line M1 (SLT) and the complementary search line M1 (SLC) transmitting the complementary signal may have different electrical properties. Different from the above example, in the first example embodiment, the true search line M1 (SLT) and the complementary search line M1 (SLC) may not be adjacent to each other. The true search line M1 (SLT) and the complementary search line M1 (SLC) may be formed in the same process. Accordingly, in the first example embodiment, the true search line M1 (SLT) and the complementary search line M1 (SLC) may have the same electrical properties, such that complementary signal transmission performance may improve. Accordingly, data retrieval performance of the TCAM cell may improve.

Referring to FIGS. 7 and 8, the semiconductor device 200 in the first example embodiment may include active regions ACT formed on the substrate 201, gate structures GS disposed between the active regions ACT, and active contacts CNT connected to active regions ACT. A channel region 203 may be defined between the active regions ACT adjacent to each other in the first direction, and at least one of the gate structures GS may be disposed on the channel region 203. The gate structures GS may extend in the second direction.

In the example embodiment described with reference to FIGS. 7 and 8, it may be assumed that the channel region 203 included in the semiconductor device 200 may be provided by fin structures, but may be implemented as a nanowire or a nanosheet disposed the substrate 201 and at least partially surrounded by the gate structures GS. When the channel region 203 is implemented as a nanowire, a nanosheet, or the like, the channel region 203 may be separated from the substrate 201 in the third direction. In other embodiments, the channel region 203 may not protrude in the third direction, and upper surfaces of the active regions ACT may be coplanar with the upper surfaces of the channel region 203. In other words, each of the semiconductor devices may be implemented as a general planar transistor.

Referring to FIG. 7, each of the gate structures GS may include a gate spacer 211, a gate insulating layer 212, a gate conductive layer 213, and a capping layer 214. However, in different example embodiments, the structure of each of the gate structures GS may be varied. For example, a thickness and/or a material of the gate insulating layer 212 may be changed in consideration of a threshold voltage of each of the semiconductor devices, or the material and/or the stacked structure of the gate conductive layer 213 may be changed.

The channel region 203 may be provided by fin structures formed in a third direction perpendicular to the upper surface of the substrate 201, and the gate insulating layer 212 of the gate structures GS may have a shape conforming to the fin structure. In other words, both side surfaces and upper surfaces of the fin structures may be in contact with the gate insulating layer 212. The gate insulating layer 212 may be in contact with side surfaces and upper surfaces of the fin structures, and a gate conductive layer 213 and a capping layer 214 may be formed on the gate insulating layer 212.

The semiconductor device 200 may include an interlayer insulating layer 270, and the interlayer insulating layer 270 may include a plurality of interlayer insulating layers 271 to 277. For example, the first interlayer insulating layer 271 may be disposed on the same level in the third direction as a level of the gate structures GS and the active contacts CNT, and the second interlayer insulating layer 272 may be disposed on the same level in the third direction as a level of the gate contact CB and the active via VA. The third interlayer insulating layer 273 may be disposed on the same level in the third direction as a level of the first wiring layer, and the fourth interlayer insulating layer 274 may be disposed on the same level in the third direction as a level of the lower via V1. The fifth interlayer insulating layer 275 may be disposed on the same level in the third direction as a level of the second wiring layer, the sixth interlayer insulating layer 276 may be disposed on the same level in the third direction as a level of the intermediate via V2, and the seventh interlayer insulating layer 277 may be disposed on the same level in the third direction as a level of the third wiring layer. The interlayer insulating layer 270 may be formed of silicon oxide, silicon nitride, silicon oxynitride, or the like.

The gate contact CB may be connected to the gate conductive layer 213, and may penetrate the first and second interlayer insulating layers 271 and 272, for example. A lower surface of the gate contact CB may be in contact with the gate conductive layer 213, and an upper surface of the gate contact CB may be disposed in a position higher than a level of the upper surface of the active contacts CNT. For example, an upper surface of the gate contact CB may be disposed on the same level in the third direction as a level of an upper surface of the interlayer insulating layer 272.

The active regions ACT may be connected to the channel region 203 in the first direction. For example, the active regions ACT may be formed by applying a selective epitaxial growth process to the substrate 201. The active regions ACT may be connected to the active contacts CNT, and for example, the active contacts CNT may be formed in a shape of being recessed into a portion of the active regions ACT. The active regions ACT physically separated from each other in the second direction may be electrically connected to each other by each of the active contacts CNT.

Referring to FIG. 7, the lower surface of the active via VA may be disposed on the same level in the third direction as a level of the upper surface of the first interlayer insulating layer 271 and may be in contact with the active via VA. Accordingly, the lower surface of the active via VA may be disposed between the upper surface of the gate structures GS and the upper surface of the gate contact CB in the third direction. However, example embodiments thereof are not limited thereto, and in other example embodiments, the arrangement form and the levels of the active via VA, the gate structures GS, and the gate contact CB may be varied.

The active contacts CNT may be adjacent to the gate structures GS in the first direction and may be connected to the active regions ACT. The active regions ACT may be formed of metal, metal silicide, and/or polysilicon, and may include two or more layers formed of different materials. For example, each of the active contacts CNT may include a metal silicide layer and/or a metal layer, and in an example embodiment, each of the active contacts CNT may include a metal silicide layer in direct contact with the active regions ACT, and a metal layer disposed on the metal silicide layer.

At least one of the active contacts CNT may be connected to one of the lower wiring patterns M1 through the active via VA disposed thereon. The active via VA and the lower wiring patterns M1 may also include a plurality of layers, and may include, for example, a barrier metal layer and a fill metal layer. In example embodiments, the lower wiring patterns M1 and the active via VA may be formed in a single process. In this case, the lower wiring patterns M1 and the barrier metal layer of the active via VA may be connected to each other as a single or monolithic component, and, the fill-metal layers may also be connected to each other as a single or monolithic component.

The lower wiring pattern M1 may be connected to the intermediate wiring pattern M2 through the lower via V1. For example, a layer on which the lower wiring patterns M1 is disposed may be defined as a first wiring layer, and a layer on which the intermediate wiring patterns M2 is disposed may be defined as a second wiring layer.

Although not provided in the layout diagrams in FIGS. 3 to 6, the semiconductor device 200 in the first example embodiment may further include a third wiring layer. Referring to FIGS. 7 and 8, the intermediate wiring pattern M2 may be connected to the upper wiring pattern M3 through the intermediate via V2. A layer on which the upper wiring patterns M3 are disposed may be defined as a third wiring layer. The upper wiring patterns M3 may extend in the second direction in parallel with the intermediate wiring patterns M2. Also, the upper wiring patterns M3 may overlap the intermediate wiring patterns M2 in the third direction. The upper wiring pattern M3 may transmit the same signal as that of the overlapping intermediate wiring pattern M2. For example, a ground wiring M3 (VSS) may be formed on the ground wiring M2 (VSS), a data word line M3 (CWL) may be formed on the data word line M2 (CWL), and a mask word line M3 (MWL) may be formed on the mask word line M2 (MWL). In the first example embodiment, because two wiring patterns, that is, the intermediate wiring pattern M2 and the upper wiring pattern M3, may be used to transmit the same signal, resistance of the ground wiring, the data word line, and the mask word line may be reduced, and operating performance of the TCAM may improve.

Referring to FIG. 8, semiconductor devices may be separated from each other in the semiconductor device by the device isolation layer 202 formed on the substrate 201. For example, the semiconductor devices disposed on both sides of the device isolation layer 202 in the second direction may be a PMOS device and an NMOS device, respectively.

In the first example embodiment, lower wiring patterns M1 may be formed in nine tracks (①-⑨) in the second direction. When adjacent TCAM cells share the lower wiring patterns M1 on both ends, the lower wiring patterns M1 may be formed in eight tracks on average in the second direction per TCAM cell. Comparing the comparative example described with reference to FIG. 2 with the first example embodiment, the number of tracks on which the lower wiring patterns M1 are disposed per TCAM cell may be reduced by two, and the length of the TCAM cell in the second direction may decrease. Accordingly, integration density of the semiconductor device may improve.

Figure 9:
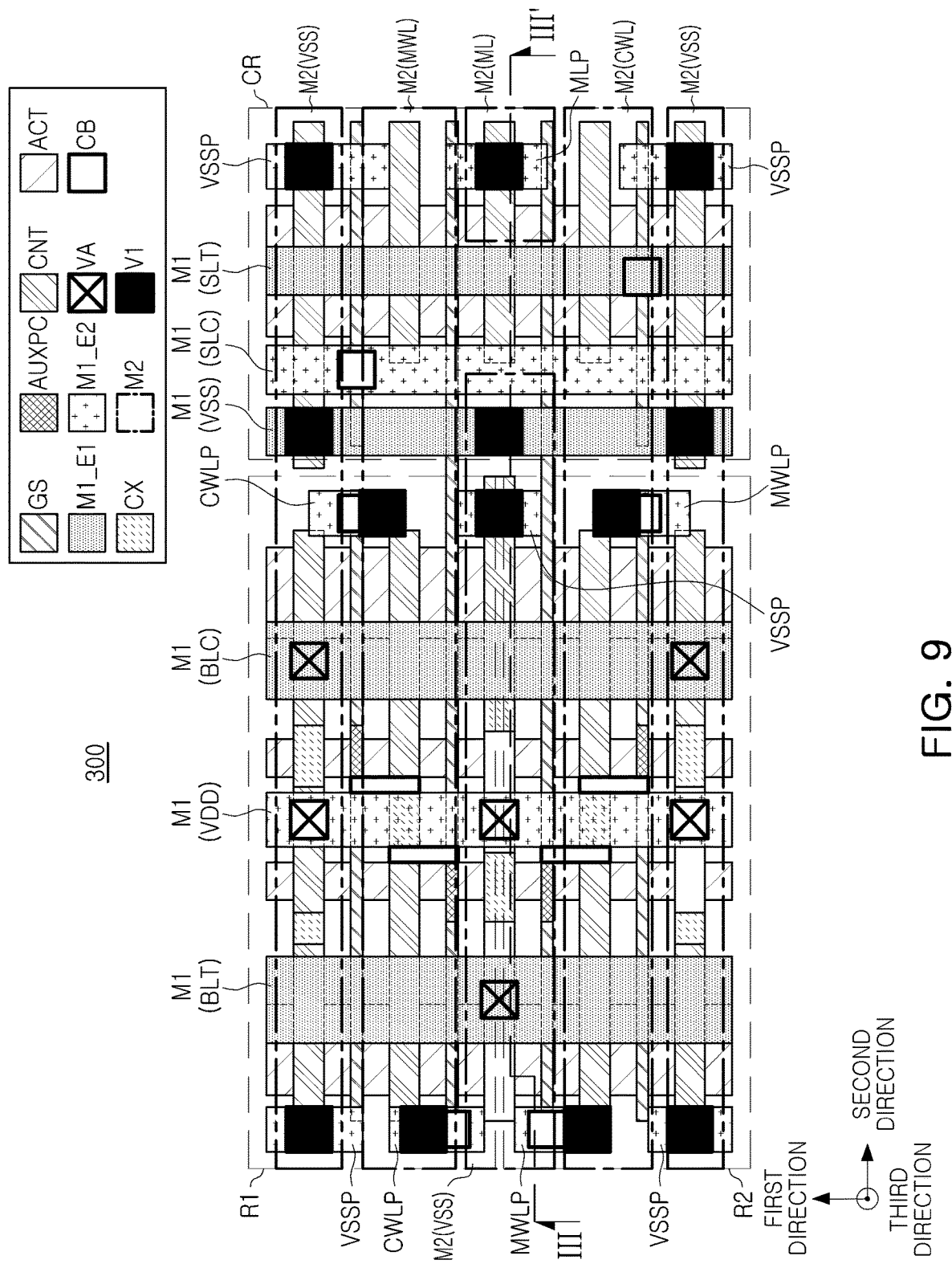
FIG. 9 is a layout diagram illustrating a semiconductor device according to a second example embodiment of the present inventive subject matter.
Figure 10:
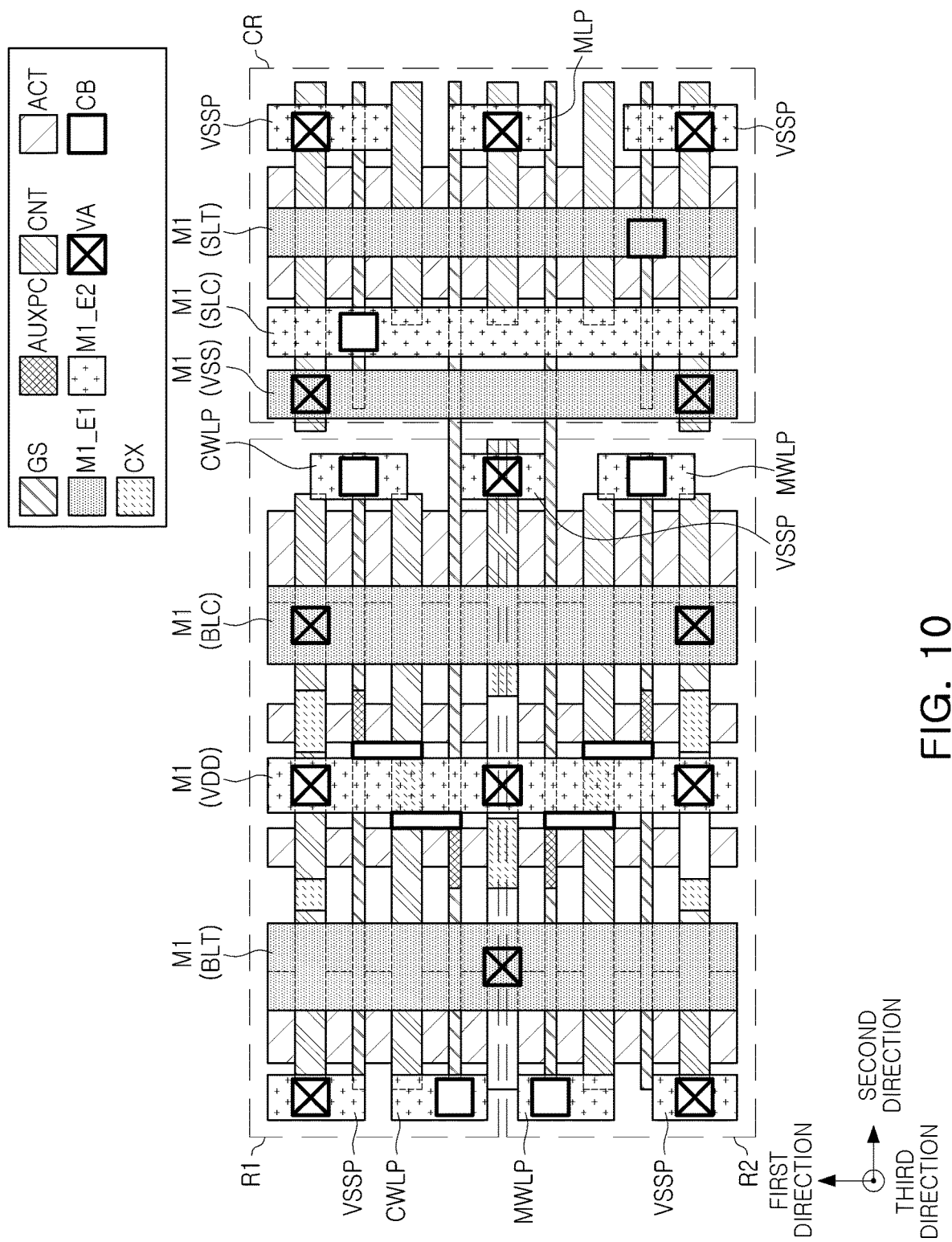
FIG. 10 is a layout diagram illustrating an example in which a first wiring layer is added to the layout of a front-end process of the layout diagram in FIG. 9.
Figure 11:
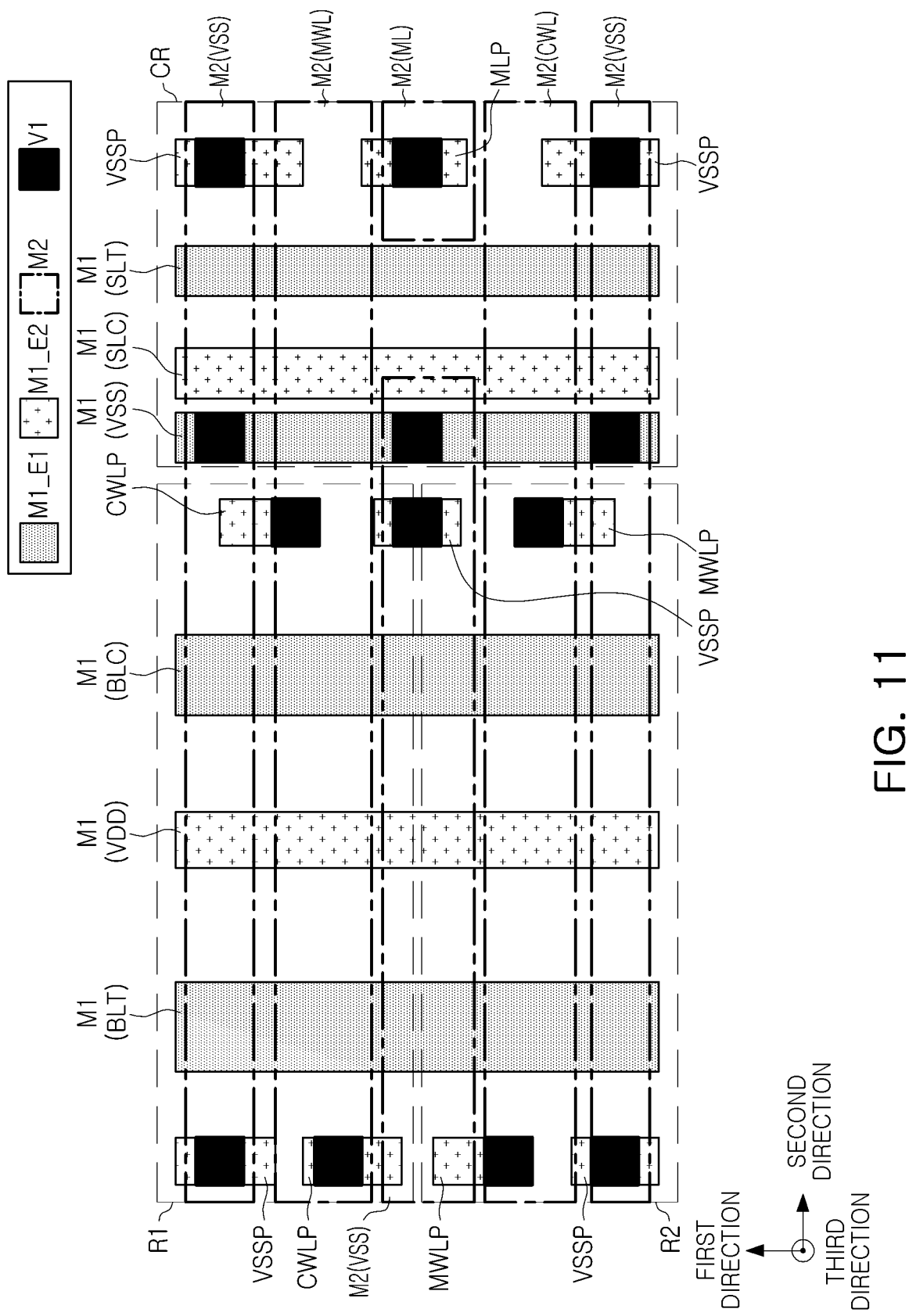
FIG. 11 is a layout diagram illustrating first and second wiring layers in the layout diagram in FIG. 9.
Figure 12:
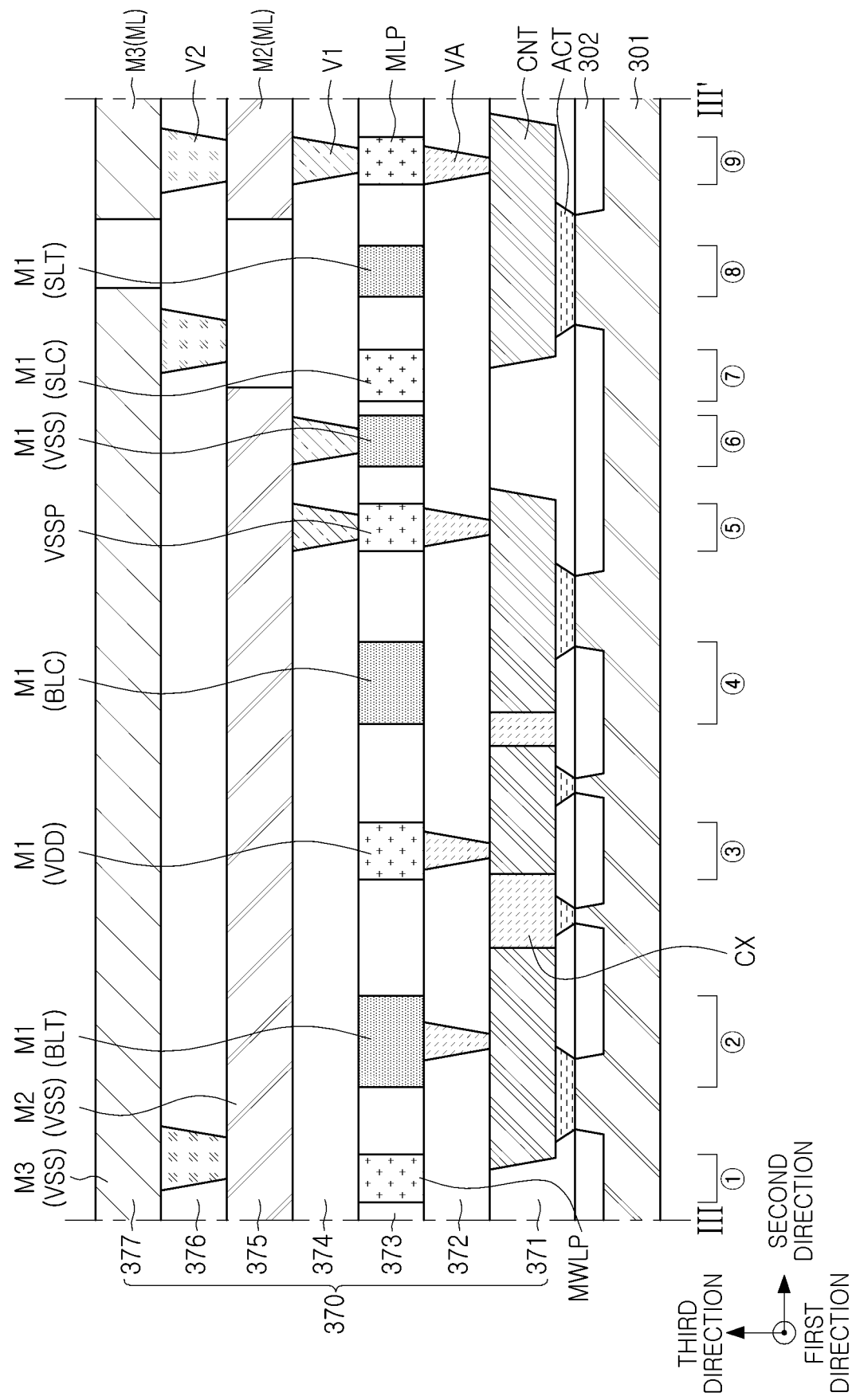
FIG. 12 is a cross-sectional diagram illustrating the layout in FIG. 9 taken along line III-III'.

FIG. 9 is a layout diagram illustrating a semiconductor device according to a second example of some embodiments of the inventive subject matter. FIG. 10 is a layout diagram illustrating an example in which a first wiring layer is added to the layout of a front-end process of the layout diagram in FIG. 9. FIG. 11 is a layout diagram illustrating first and second wiring layers in the layout diagram in FIG. 9. FIG. 12 is a cross-sectional diagram illustrating the layout in FIG. 9 taken along line III-III'.

Referring to FIGS. 9 to 12, a semiconductor device 300 in the second example embodiment may include a substrate 301, active regions ACT, gate structures GS, active contacts CNT, and wiring patterns M1, M2, and M3.

The substrate 301 may be formed of one or more semiconductor materials including, but not limited to, Si, Ge, SiGe, GaP, GaAs, SiC, SiGeC, InAs, and/or InP. Also, a silicon on insulator (SOI) substrate may be used.

The substrate 301 may include a first cell region R1, a second cell region R2, and a comparison region CR. The first cell region R1, the second cell region R2, and the comparison region CR may be included in a TCAM cell region, and each region may correspond to the example described with reference to FIG. 1. The first cell region R1, the second cell region R2, and the comparison region CR may be disposed similarly to the first example embodiment described with reference to FIGS. 3 to 8.

Referring to FIGS. 9 to 10, the semiconductor device 300 may include active regions ACT extending in a first direction and spaced apart from each other in a second direction. Also, the semiconductor device 300 may include gate structures GS extending in the second direction and spaced apart from each other in the first direction. Active contacts CNT may extend in the second direction between the gate structures GS. The active contacts CNT may connect the active regions ACT to the wiring patterns.

One of the gate structures GS and the active regions ACT disposed on both sides thereof may provide a transistor. Transistors included in the semiconductor device 300 may be connected to each other and may provide the circuit described with reference to FIG. 1. That is, the semiconductor device 300 may provide a circuit including include pass transistors PS1-PS4, pull-up transistors PU1-PU4, pull-down transistors PD1-PD4, and first to fourth transistors T1-T4. Transistors in the first cell region R1, the second cell region R2, and the comparison region CR may be disposed in the same manner as described with reference to FIG. 4.

Referring to FIG. 10, a first wiring layer including lower wiring patterns M1 may be formed on the transistors disposed in the same manner as described with reference to FIG. 4. The lower wiring pattern M1 may extend in the first direction and may be spaced apart from each other in the second direction. A portion of the lower wiring patterns M1 may be disposed in the same position in the second direction and may be insulated from each other.

Referring to FIG. 11, a second wiring layer including intermediate wiring patterns M2 may be included in a region above (i.e., in the third direction) the first wiring layer. The intermediate wiring patterns M2 may extend in the second direction and may be spaced apart from each other in the first direction. A portion of the intermediate wiring patterns M2 may be disposed in the same position in the first direction and may be insulated from each other.

Referring to FIGS. 10 and 11, the pass transistors PS1-PS4 may be connected to the data word line CWL and the mask word line MWL in a manner similar to the example described with reference to FIGS. 4 to 6, and the second and fourth transistors T2 and T4 may be connected to the match line ML in a manner similar to the example described with reference to FIGS. 4 to 6. Also, the pull-up transistors PU1-PU4 may be connected to the power supply wiring M1 (VDD) in a manner similar to the example described with reference to FIGS. 4 to 6 and may receive the external power VDD.

Referring to FIG. 11, the ground wiring M1 (VSS) on the comparison region CR may be connected to the ground wirings M2 (VSS) formed in the second wiring layer through the lower via V1. A match line ML may be formed in the second wiring layer, and one of the ground wirings M2 (VSS) may be disposed in the same position as the match line ML in the first direction.

In the second example embodiment, the ground wirings M1 (VSS) may be removed from the first wiring layer on the first cell region R1 and the second cell region R2, and the first wiring layer on the comparison region CR may include a ground wiring M1 (VSS). Similar to the example described with reference to FIGS. 5 to 6, the ground wiring M1 (VSS) on the comparison region CR may be connected to an external ground, and may provide a ground for the first to fourth pull-down transistors PD1-PD4 and the first to fourth transistors T1-T4.

Referring to FIG. 12, the semiconductor device 300 in the second example embodiment may include active regions ACT formed on a substrate 301, a gate structure GS disposed between the active regions ACT, and active contacts CNT connected to the active regions ACT. Also, semiconductor devices may be separated from each other in the semiconductor device by a device isolation layer 302 formed on the substrate 301 of the semiconductor device 300. Also, the semiconductor device 300 may further include an interlayer insulating layer 370 including a plurality of interlayer insulating layers 371-377. The structure and arrangement of the gate structures GS, the active regions ACT, the active contacts CNT, and the device isolation layer 302 of the semiconductor device 300 may be similar to the examples described with reference to FIGS. 7 and 8, and the interlayer insulating layer 370 may be similar to the interlayer insulating layer 270 described with reference to FIGS. 7 and 8.

Similar to the first example embodiment described with reference to FIGS. 3 to 8, the number of lower wiring patterns M1 required per TCAM cell may be eight on average. Comparing the comparative example described with reference to FIG. 2 with the second example embodiment, the number of lower wiring patterns M1 required per TCAM cell may be reduced by two. Accordingly, integration density of the semiconductor device may improve.

Also, in the second example embodiment, the ground wiring M1 (VSS) on the comparison region CR may be formed to be adjacent to the storage region SR. A complementary search line M1 (SLC) and a true search line M1 (SLT) may be formed between the ground wiring M1 (VSS) and the match line pad MLP. That is, the ground wiring M1 (VSS) formed in the first wiring layer and the match line pad MLP may be sufficiently spaced apart from each other, and the ground wiring M2 (VSS) and the match line ML formed in the second wiring layer may also be sufficiently spaced apart from each other. Because the ground wiring M2 (VSS) and the match line ML may be spaced apart from each other, interference between signals may be reduced.

Figure 13:
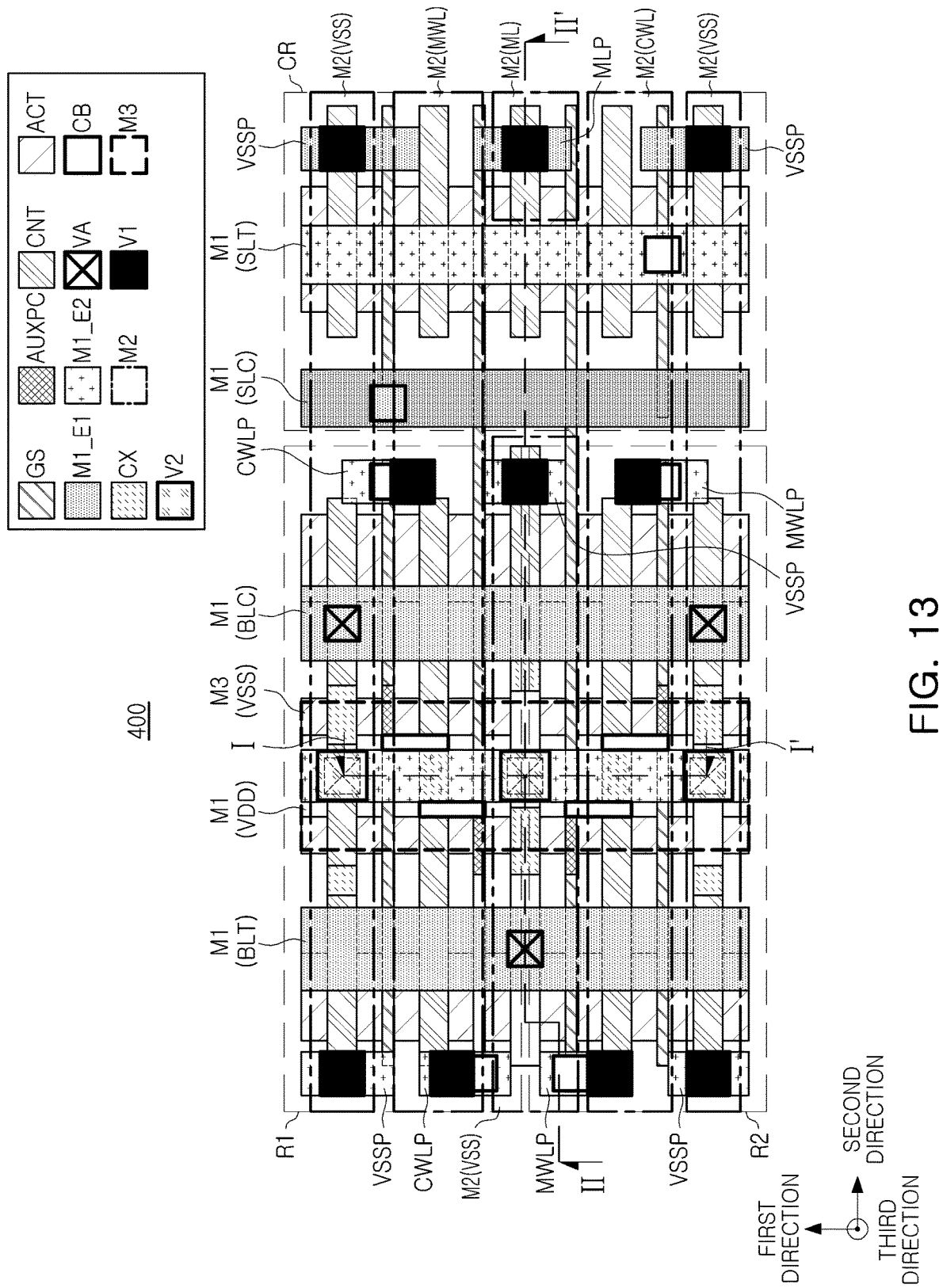
FIG. 13 is a layout diagram illustrating a semiconductor device according to a third example embodiment of the present inventive subject matter.
Figure 14:
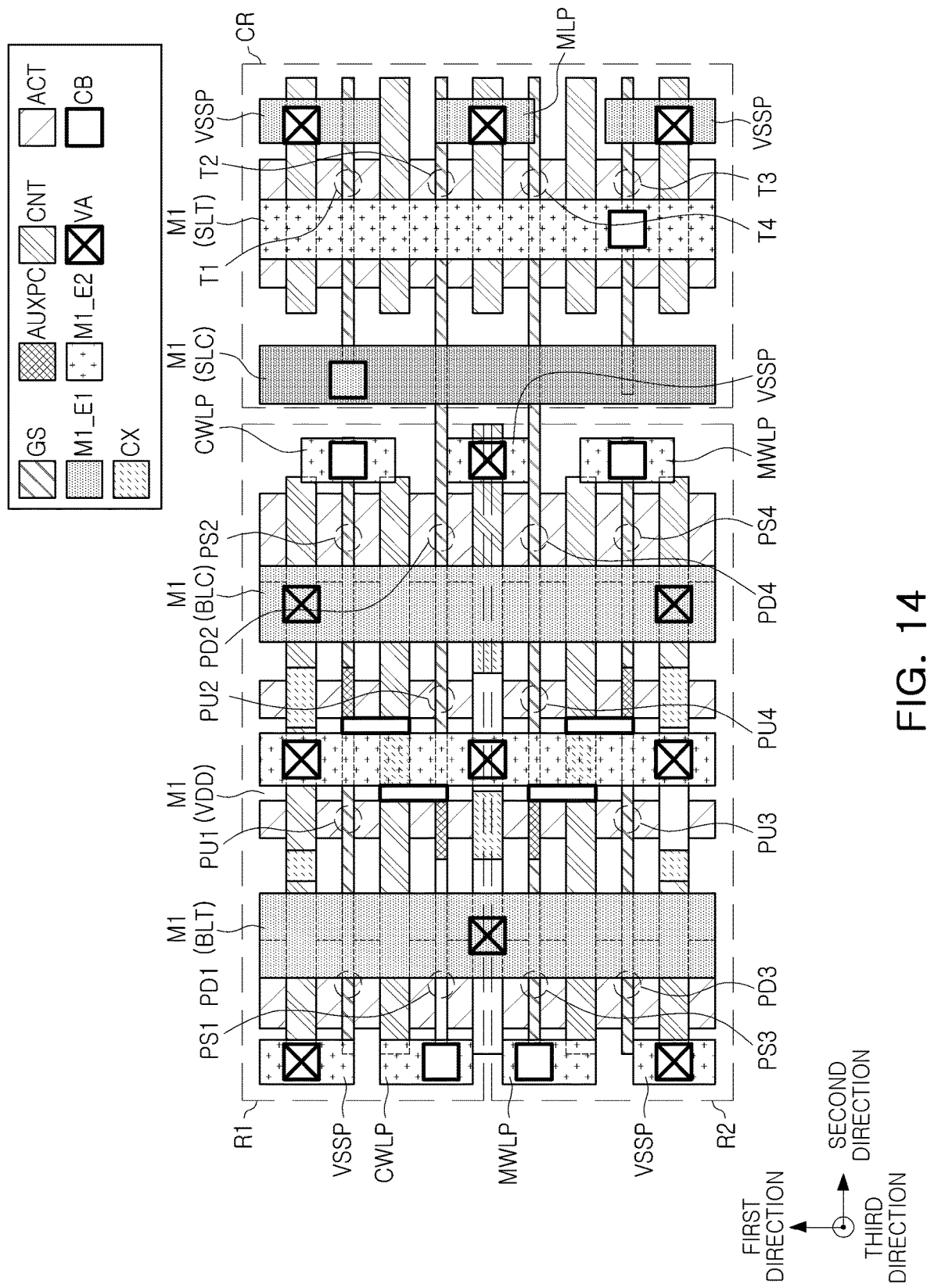
FIG. 14 is a layout diagram illustrating an example in which a first wiring layer is added to the layout of a front-end process of the layout diagram in FIG. 13.
Figure 15:
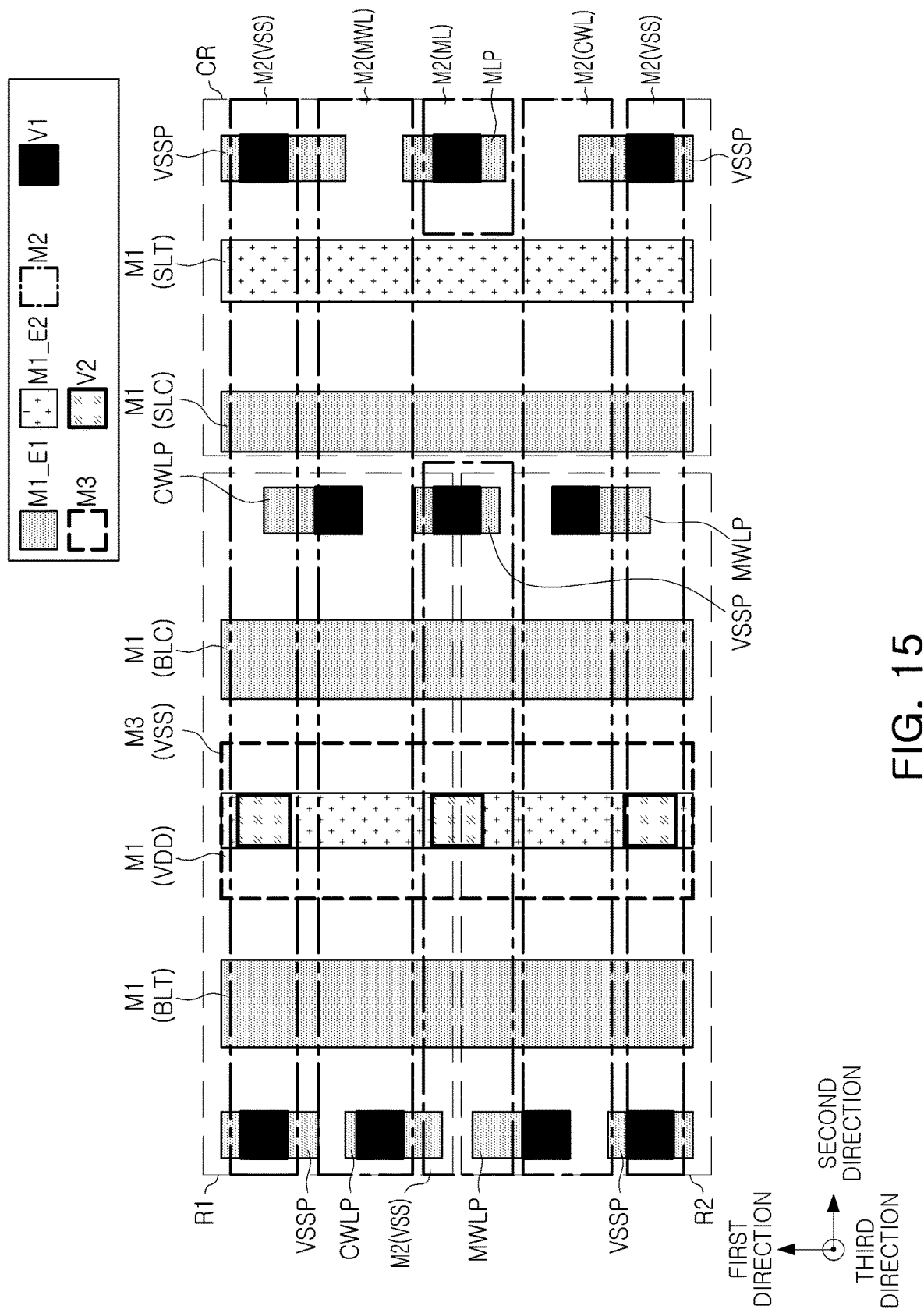
FIG. 15 is a layout diagram illustrating first to third wiring layers in the layout diagram in FIG. 13.
Figure 16:
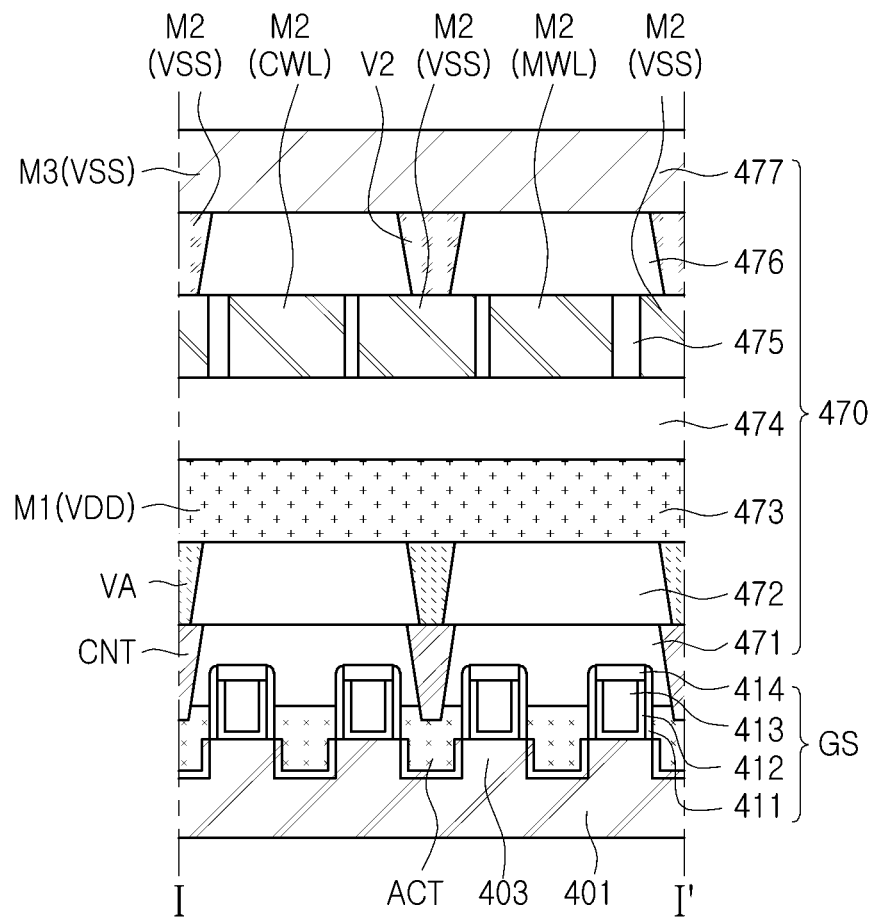
FIG. 16 is a cross-sectional diagram illustrating the layout in FIG. 3 taken along line I-I'.
Figure 17:
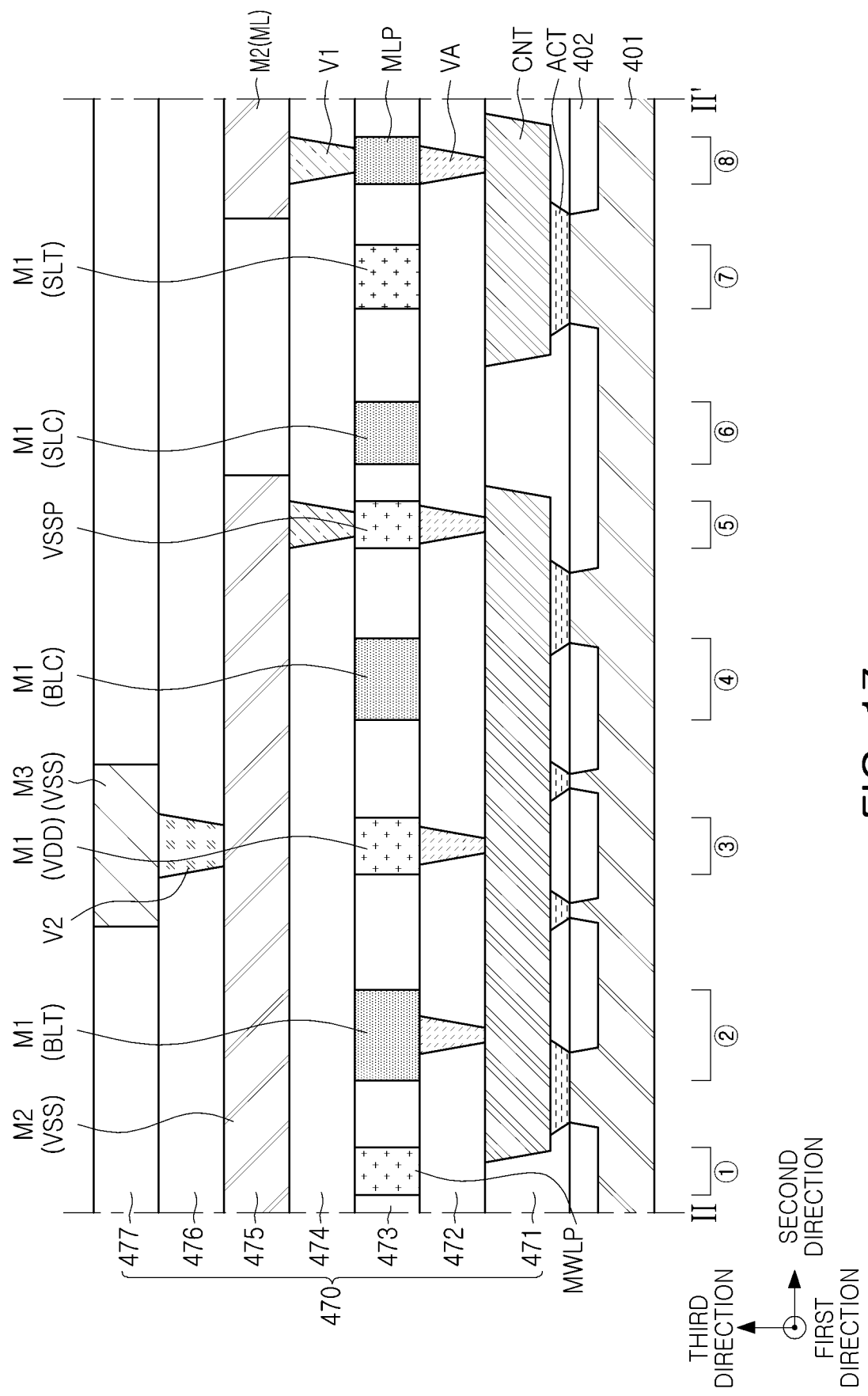
FIG. 17 is a cross-sectional diagram illustrating the layout in FIG. 3 taken along line II-II'.

FIG. 13 is a layout diagram illustrating a semiconductor device according to a third example of some embodiments of the inventive subject matter. FIG. 14 is a layout diagram illustrating an example in which a first wiring layer is added to the layout of a front-end process of the layout diagram in FIG. 13. FIG. 15 is a layout diagram illustrating first to third wiring layers in the layout diagram in FIG. 13. FIG. 16 is a cross-sectional diagram illustrating the layout in FIG. 3 taken along line I-I'. FIG. 17 is a cross-sectional diagram illustrating the layout in FIG. 3 taken along line II-II'.

Referring to FIGS. 13 to 17, a semiconductor device 400 in the second example embodiment may include a substrate 401, active regions ACT, gate structures GS, active contacts CNT and wiring patterns M1, M2, and M3.

The substrate 401 may be formed of one or more semiconductor materials including, but not limited to, Si, Ge, SiGe, GaP, GaAs, SiC, SiGeC, InAs, and/or InP. Also, a silicon on insulator (SOI) substrate may be used.

The substrate 401 may include a first cell region R1, a second cell region R2, and a comparison region CR. The first cell region R1, the second cell region R2, and the comparison region CR may be included in a TCAM cell region, and each region may correspond to the example described with reference to FIG. 1. The first cell region R1, the second cell region R2, and the comparison region CR may be disposed similarly to the first and second example embodiments described with reference to FIGS. 3 to 12.

Referring to FIGS. 13 to 14, the semiconductor device 400 may include active regions ACT extending in a first direction and spaced apart from each other in a second direction. Also, the semiconductor device 400 may include gate structures GS extending in the second direction and spaced apart from each other in the first direction. Active contacts CNT may extend in the second direction between the gate structures GS. The active contacts CNT may connect the active regions ACT to the wiring patterns.

One of the gate structures GS and the active regions ACT disposed on both sides thereof may provide a transistor. Transistors included in the semiconductor device 300 may be connected to each other and may provide the circuit described with reference to FIG. 1. That is, the semiconductor device 400 may provide a circuit including pass transistors PS1-PS4, pull-up transistors PU1-PU4, pull-down transistors PD1-PD4, and first to fourth transistors T1-T4. Transistors in the first cell region R1, the second cell region R2, and the comparison region CR may be disposed in the same manner as described with reference to FIG. 4.

Referring to FIG. 14, a first wiring layer including lower wiring patterns M1 may be formed on the transistors disposed in the same manner as described with reference to FIG. 4. The lower wiring pattern M1 may extend in the first direction and may be spaced apart from each other in the second direction. A portion of the lower wiring patterns M1 may be disposed in the same position in the second direction and may be insulated from each other.

Referring to FIG. 15, a second wiring layer including intermediate wiring patterns M2 may be included in a region above (i.e., in the third direction) the first wiring layer. The intermediate wiring patterns M2 may extend in the second direction and may be spaced apart from each other in the first direction. A portion of the intermediate wiring patterns M2 may be disposed in the same position in the first direction and may be insulated from each other. Also, a third wiring layer including an upper wiring pattern M3 may be further included in a region above (i.e., in the third direction) the second wiring layer.

Referring to FIGS. 14 and 15, the pass transistors PS1-PS4 may be connected to the data word line CWL and the mask word line MWL in a manner similar to the example described with reference to FIGS. 4 to 6, and the second and fourth transistors T2 and T4 may be connected to the match line ML in a manner similar to the example described with reference to FIGS. 4 to 6. Also, the pull-up transistors PU1-PU4 may be connected to the power supply wiring M1 (VDD) in a manner similar to the example described with reference to FIGS. 4 to 6 and may receive the external power VDD.

In the third example embodiment, the ground wirings M1 (VS S) may be removed from the first wiring layer on the first cell region R1 and the second cell region R2. Also, the ground wiring M1 (VS S) included in the first wiring layer on the comparison region CR may be removed. In the second example embodiment, the third wiring layer on the TCAM cell region may include a ground wiring M3 (VSS) connected to an external ground. Also, the first to fourth pull-down transistors PD1-PD4 and the first to fourth transistors T1-T4 may be connected to an external ground through a ground wiring M3 (VS S) formed in the third wiring layer.

Specifically, referring to FIG. 15, the ground wiring M3 (VSS) of the third wiring layer may be connected to the ground wirings M2 (VS S) formed on the second wiring layer through the intermediate via V2. The ground wirings M2 (VSS) may be connected to the ground pads VSSP of the first wiring layer through the lower via V1.

Referring to FIG. 14, the active contact CNT adjacent to the first pull-down transistor PD1 may be connected to the ground pad VSSP through the active via VA. Similarly, the active contact CNT shared by the second and third pull-down transistors PD2 and PD3 may be connected to the ground pad VSSP through the active via VA, and the active contact CNT adjacent to the fourth pull-down transistor PD4 may be connected to the ground pad VSSP through the active via VA. Also, each of the active contact CNT adjacent to the first transistor T1 and the active contact CNT adjacent to the third transistor T3 may be connected to the ground pad VSSP through the active via VA.

In the comparative example described with reference to FIG. 2, three ground wirings M1 (VSS) may be formed on the first wiring layer on the TCAM cell region to provide a ground to the transistors of the TCAM cell. Different from the above example, in the third example embodiment, three ground wirings M1 (VSS) formed in the first wiring layer may be removed, and a ground may be provided to the transistors of the TCAM cell using the ground wiring M3 (VSS) formed on the third wiring layer.

In example embodiments, the ground wiring M3 (VSS) of the third wiring layer may overlap the power supply wiring M1 (VDD) of the first wiring layer in the third direction. Also, the ground pads VSSP may be disposed in the same position as the data word line pad CWLP, the mask word line pad MWLP, or the match line pad MLP in the second direction. Accordingly, the number of tracks on which the lower wiring patterns M1 are disposed in the second direction in the TCAM cell may decrease, and the length of the TCAM cell in the second direction may decrease. Accordingly, integration density of a semiconductor circuit including TCAM cells may improve.

Referring to FIGS. 16 and 17, the semiconductor device 400 in the third example embodiment may include active regions ACT formed on a substrate 401, gate structures GS disposed between the active regions ACT, and active contacts CNT connected to the active regions ACT. Also, semiconductor devices may be separated from each other in the semiconductor device by a device isolation layer 402 formed on the substrate 401 of the semiconductor device 400. Also, the semiconductor device 400 may further include an interlayer insulating layer 470 including a plurality of interlayer insulating layers 471-477. The structure and arrangement of the gate structures GS, the active regions ACT, the active contacts CNT, and the device isolation layer 402 of the semiconductor device 400 may be similar to the examples described with reference to FIGS. 7 and 8, and the interlayer insulating layer 470 may be similar to the interlayer insulating layer 270 described with reference to FIGS. 7 and 8.

Referring to FIG. 16, the semiconductor device 400 may include a ground wiring M3 (VSS) overlapping the power supply wiring M1 (VDD) formed on the first wiring layer in the third direction and formed on the third wiring layer. The ground wiring M3 (VSS) of the third wiring layer may be connected to an external ground, and may be connected to the ground wiring M2 (VSS) of the second wiring layer through the intermediate via V2 and may provide a ground to the transistor devices of the TCAM cell.

Referring to FIG. 17, in the third example embodiment, lower wiring patterns M1 may be formed in eight tracks (①-⑦) in the second direction on the TCAM cell region. When TCAM cells adjacent to each other share the lower wiring patterns M1 on both ends, the lower wiring patterns M1 may be disposed in seven tracks on average per TCAM cell. Comparing the comparative example described with reference to FIG. 2 with the second example embodiment, the number of tracks in which the lower wiring patterns M1 are disposed per TCAM cell may be reduced by three, and the length of the TCAM cell in the second direction may decrease. Accordingly, integration density of the semiconductor device may improve.

In the example embodiments described with reference to FIGS. 3 to 17, the ground wirings M1 (VS S) included in the first wiring layer on the first cell region R1 and the second cell region R2 may be removed, such that the area of the TCAM cell may be reduced, and integration density of the semiconductor device may improve.

In particular, in the first example embodiment, the ground wiring M1 (VS S) formed on the first wiring layer on the comparison region CR and providing a ground to the transistors of the TCAM cell region be disposed between the true search line SLT and the complementary search line SLC. By disposing the ground wiring M1 (VSS) between the true search line SLT and the complementary search line SLC, the true search line SLT and the complementary search line SLC for transmitting the complementary signal may have the same electrical properties, such that performance of the TCAM cell may improve.

Also, in the first example embodiment, by forming, on the third wiring layer, wiring patterns transmitting the same signal as that of the wiring patterns formed on the second wiring layer, resistance of the signal lines may be reduced and performance of the TCAM cell may improve.

In the second example embodiment, the ground wiring M1 (VSS) formed on the first wiring layer may be disposed adjacent to the storage region SR. The ground wiring M1 (VSS) may be spaced apart from the match line pad MLP. Accordingly, ground wiring M2 (VSS) disposed in the same position as the match line ML in the first direction on the second wiring layer may be sufficiently spaced apart from the match line ML. Because the match line ML and the ground wiring M2 (VSS) for transmitting different signals may be sufficiently spaced apart, interference between signals may be prevented, and performance of the TCAM cell may improve.

In the third example embodiment, a ground wiring M3 (VSS) connected to an external ground and providing a ground to the transistors of the TCAM cell region may be disposed on the third wiring layer. In the second example embodiment, the ground wiring M1 (VSS) on the comparison region CR may also be removed, such that integration density of the semiconductor device may improve.

According to the aforementioned example embodiments, a semiconductor device having improved integration and performance may be provided.

Also, the layout of the metal wiring formed on the TCAM cell region may improve. Specifically, the number of wirings in the lower wiring layer required for a single TCAM cell may be reduced. Also, electrical properties of wiring patterns transmitting a complementary signal among wiring patterns of the lower wiring layer may coincide with each other. Accordingly, integration density and performance of a semiconductor device including the TCAM cells may improve.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
   a substrate including a first memory cell, a second memory cell adjacent to the first memory cell in a first direction, and a comparator circuit adjacent to the first and second memory cells in a second direction intersecting the first direction;
   a true bit line and a complementary bit line electrically connected to the first and second memory cells and extending in the first direction from a first wiring layer on the substrate;

a first power supply wiring on the first wiring layer, extending in the first direction between the true bit line and the complementary bit line, and electrically connected to the first and second memory cells;

first and second word lines extending in the second direction from a second wiring layer on the substrate different from the first wiring layer;

first word line pads on the first wiring layer and electrically connecting the first memory cell to the first word line;

second word line pads on the first wiring layer and electrically connecting the second memory cell to the second word line; and a first ground pad on the first wiring layer, electrically connected to the first and second memory cells, and in a same position as one of the first word line pads and one of the second word line pads in the second direction.

2. The semiconductor device of claim 1, further comprising:

a first ground wiring on the first wiring layer and electrically connected to the comparator circuit and an external ground; and a second ground wiring on the second wiring layer and electrically connecting the first ground pad to the first ground wiring.

3. The semiconductor device of claim 2, further comprising:

a true search line and a complementary search line extending in the first direction from the first wiring layer and electrically connected to the comparator circuit, wherein the first ground wiring extends in the first direction between the true search line and the complementary search line.

4. The semiconductor device of claim 2, wherein the second ground wiring extends in the second direction between the first and second word lines.

5. The semiconductor device of claim 2, further comprising:

a first match line extending in the second direction from the second wiring layer; and a match line pad on the first wiring layer and electrically connecting the first match line to the comparator circuit, wherein the second ground wiring extends in the second direction and is in a same position as the first match line in the first direction.

6. The semiconductor device of claim 5, further comprising:

a second match line extending in the second direction to a third wiring layer on the substrate different from the first and second wiring layers, the second match line and the first match line being configured to transmit a same signal; and a third ground wiring extending in the second direction to the third wiring layer, the third ground wiring and the second ground wiring being configured to transmit a same signal, wherein the first and second match lines overlap each other in a third direction perpendicular to the substrate, and the second and third ground wirings overlap each other in the third direction.

7. The semiconductor device of claim 1, further comprising:

a first ground wiring extending in the first direction from the first wiring layer and electrically connected to the comparator circuit and an external ground;

a true search line and a complementary search line extending in the first direction from the first wiring layer and electrically connected to the comparator circuit; and a match line pad electrically connected to the comparator circuit on the first wiring layer, wherein the true search line and the complementary search line are between the first ground wiring and the match line pad.

8. The semiconductor device of claim 7, further comprising:

a second ground wiring extending in the second direction from the second wiring layer and electrically connected to the first ground wiring; and a match line extending in the second direction from the second wiring layer and electrically connected to the match line pad, wherein the second ground wiring and the match line are in a same position in the first direction.

9. The semiconductor device of claim 1, further comprising:

a first match line extending in the second direction from the second wiring layer;

a match line pad on the first wiring layer and electrically connecting the first match line to the comparator circuit; and a second ground pad on the first wiring layer, electrically connected to the comparator circuit, and in a same position as the match line pad in the second direction.

10. The semiconductor device of claim 9, further comprising:

a fourth ground wiring on a third wiring layer on the substrate different from the first and second wiring layers and electrically connected to an external ground; and fifth ground wirings on the second wiring layer and electrically connecting each of the first ground pad and the second ground pad to the fourth ground wiring.

11. The semiconductor device of claim 10, wherein the fourth ground wiring overlaps the first power supply wiring in a third direction perpendicular to the substrate.

12. The semiconductor device of claim 9, further comprising:

a main search line and a complementary search line extending in the first direction from the first wiring layer and electrically connected to the comparator circuit, wherein the main search line and the complementary search line are adjacent to each other in the second direction.

13. A semiconductor device, comprising:

a substrate including a storage region and a comparison region;

first to fourth active regions extending in a first direction from the storage region and spaced apart from each other in a second direction intersecting the first direction;

a fifth active region spaced apart from the fourth active region in the second direction in the comparison region and extending in the first direction;

first and fourth gate structures extending in the second direction and intersecting the first to fourth active regions;

second and third gate structures extending in the second direction and intersecting the first to fifth active regions;
a fifth gate structure extending in the second direction, intersecting the fifth active region, and in a same position as the first gate electrode in the first direction;
a sixth gate structure extending in the second direction, intersecting the fifth active region, and in a same position as the fourth gate electrode in the first direction;
active contacts adjacent to the first to sixth gate structures and connected to at least one of the first to fifth active regions;
a first word line pad connected to the second gate structure, and a second word line pad in a same position as the first word line pad in the second direction and connected to the third gate structure;
a third word line pad connected to the first gate structure, and a fourth word line pad in a same position as the third word line pad in the second direction and connected to the fourth gate structure;
a first ground pad in a same position as the first and second word line pads in the second direction, connected to the first active region, and connected to an active contact adjacent to the first gate structure;
a second ground pad in a same position as the first and second word line pads in the second direction, connected to the first active region, and connected to an active contact adjacent to the fourth gate structure; and
a third ground pad in a same position as the third and fourth word line pads in the second direction, connected to the fourth active region, and connected to an active contact shared by the second and third gate structures.

14. The semiconductor device of claim 13, further comprising:
a first ground wiring extending in a first direction and connecting an active contact connected to the fifth active region and adjacent to the fifth gate structure to an active contact connected to the fifth active region and adjacent to the sixth gate structure; and
second to fourth ground wirings extending in the second direction from an upper layer of the first ground wiring and the first to third ground pads and connecting the first ground wiring to the first to third ground pads, respectively.

15. The semiconductor device of claim 14, further comprising:
a first search line extending in the first direction and connected to the fifth gate structure; and
a second search line extending in the first direction and connected to the sixth gate structure,
wherein the first ground wiring is between the first and second search lines.

16. The semiconductor device of claim 13, further comprising:
a match line pad connected to an active contact connected to the fifth active region and shared by the second and third gate structures;
a fourth ground pad in a same position as the match line pad in the second direction, connected to an active contact connected to the fifth active region, and adjacent to the fifth gate structure; and a fifth ground pad in a same position as the match line pad and the fourth ground pad in the second direction, connected to an active contact connected to the fifth active region, and adjacent to the sixth gate structure.

17. The semiconductor device of claim 16, further comprising:
a second ground wiring extending from an upper layer of the first and fourth ground pads in the second direction and connected to the first and fourth ground pads;
a third ground wiring extending from an upper layer of the third ground pad in the second direction and connected to the third ground pad;
a fourth ground wiring extending from an upper layer of the second and fifth ground pads in the second direction and connected to the second and fifth ground pads; and
a fifth ground wiring extending from an upper layer of the second to fourth ground wirings in the first direction and connected to the second to fourth ground wirings and an external ground.

18. A semiconductor device, comprising:
a substrate including an active region extending in a first direction, first to fourth gate structures intersecting the active region and extending in a second direction, active contacts adjacent to at least one of the first to fourth gate structures, and first and second memory cells connected to second and third gate structures, respectively;
a first search line extending in the first direction from a first wiring layer on the substrate and connected to the first gate structure;
a second search line extending in the first direction from the first wiring layer and connected to the fourth gate structure; and
a first ground wiring on the first wiring layer, extending in the first direction between the first and second search lines, and connected to an active contact adjacent to the first gate structure and an active contact adjacent to the fourth gate structure.

19. The semiconductor device of claim 18, further comprising:
a second ground wiring extending in the second direction from a second wiring layer on the substrate different from the first wiring layer,
wherein the first ground wiring is electrically connected to the first and second memory cells through the second ground wiring.

20. The semiconductor device of claim 19, further comprising:
first and second word lines extending in the second direction from the second wiring layer;
a first word line pad on the first wiring layer and electrically connecting the first memory cell to the first word line;
a second word line pad on the first wiring layer and electrically connecting the second memory cell to the second word line; and
a ground pad on the first wiring layer, electrically connected to the first and second memory cells, in a same position as the first and second word line pads in the second direction, and connected to the second ground wiring.

* * * * *